(12) United States Patent
Snook et al.

(10) Patent No.: US 10,199,916 B2
(45) Date of Patent: Feb. 5, 2019

(54) RESISTOR EMULATION AND GATE BOOST

(71) Applicant: Maschinenfabrik Reinhausen GmbH, Regensburg (DE)

(72) Inventors: Mark Snook, Histon (GB); Robert John Leedham, Cambridge (GB); Robin Lyle, Grantham (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 15/515,982

(22) PCT Filed: Nov. 9, 2015

(86) PCT No.: PCT/EP2015/076003
§ 371 (c)(1),
(2) Date: Mar. 30, 2017

(87) PCT Pub. No.: WO2016/075056
PCT Pub. Date: May 19, 2016

(65) Prior Publication Data
US 2017/0302151 A1 Oct. 19, 2017

(30) Foreign Application Priority Data

Nov. 11, 2014 (GB) .................................. 1420037.2
Nov. 11, 2014 (GB) .................................. 1420038.0

(51) Int. Cl.
*H02M 1/08* (2006.01)
*H03K 17/04* (2006.01)
(Continued)

(52) U.S. Cl.
CPC ................ *H02M 1/08* (2013.01); *H03K 5/08* (2013.01); *H03K 17/042* (2013.01);
(Continued)

(58) Field of Classification Search
CPC ........... H02M 1/08; H02M 2001/0009; H02M 2001/0054; H03K 5/08; H03K 17/0822; H03K 17/0828; H03K 17/168
See application file for complete search history.

(56) References Cited

U.S. PATENT DOCUMENTS 5,877,646 A 3/1999 Jorg
5,926,012 A 7/1999 Takizawa
(Continued)

FOREIGN PATENT DOCUMENTS

DE 4428675 A 2/1996
GB 2458704 A 9/2009

*Primary Examiner* — Emily P Pham
(74) *Attorney, Agent, or Firm* — Andrew Wilford

(57) ABSTRACT

A power switch driver for driving a control terminal of a power switch to drive a load, the power switch driver having a negative feedback circuit to control current delivered to the control terminal. The negative feedback circuit has a current output circuit having a current source and a current sink and serving for providing the current of the control terminal and configured to receive an output current control signal to control a magnitude of the current provided by the current output circuit, a terminal voltage input circuit for receiving a voltage from the control terminal and to output an indication of the voltage, an amplifier coupled to the terminal voltage input circuit for amplifying the terminal voltage indication to generate an amplifier output, and a reference voltage input circuit for receiving a reference voltage, having at least one resistor, and coupled to a charge supply input of the amplifier.

13 Claims, 21 Drawing Sheets

(51) Int. Cl.
*H03K 17/042* (2006.01)
*H03K 17/06* (2006.01)
*H03K 17/082* (2006.01)
*H03K 17/16* (2006.01)
*H03K 5/08* (2006.01)
*H02M 7/5387* (2007.01)
*H02M 1/00* (2006.01)

(52) U.S. Cl.
CPC ....... *H03K 17/0406* (2013.01); *H03K 17/063* (2013.01); *H03K 17/0822* (2013.01); *H03K 17/0828* (2013.01); *H03K 17/165* (2013.01); *H03K 17/168* (2013.01); *H02M 7/5387* (2013.01); *H02M 2001/0009* (2013.01); *H02M 2001/0054* (2013.01); *Y02B 70/1491* (2013.01)

(56) References Cited

U.S. PATENT DOCUMENTS

| | | |
|---|---|---|
| 6,459,324 B1 | 10/2002 | Neacsu |
| 7,570,102 B2 * | 8/2009 | Tai .......................... H02M 1/08 327/108 |
| 7,626,368 B2 * | 12/2009 | Novak .................... G05F 1/565 323/275 |
| 2004/0027193 A1 | 2/2004 | Katoh |
| 2008/0122497 A1 | 5/2008 | Ishikawa |
| 2012/0119821 A1 | 5/2012 | DenBesten |
| 2013/0147523 A1 | 6/2013 | Deboy |
| 2013/0321035 A1 * | 12/2013 | Bodano ................ H03K 17/165 327/109 |
| 2014/0203860 A1 | 7/2014 | Senda |
| 2015/0318847 A1 | 11/2015 | Sugahara |

* cited by examiner

RESISTOR EMULATION AND GATE BOOST

CROSS REFERENCE TO RELATED APPLICATIONS

This is the US-national phase of PCT application PCT/EP2015/076003 filed 9 Nov. 2015 (published 16 May 2016 as WO 2016/0750560) and itself claiming the priorities of UK patent applications 1420037.2 and 1420038.0 both filed 11 Nov. 2014.

FIELD OF THE INVENTION

This invention generally relates to power converters, to power switch drivers for driving a control terminal of a power switch to drive a load, power converters comprising such a power switch driver, and methods for controlling a drive signal to a control terminal of a power switch to drive a load.

BACKGROUND OF THE INVENTION

Power converters, such as AC to DC converters or DC to AC inverters, generally comprise networks of parallel and/or series connected power switching devices such as insulated gate bipolar transistors (IGBTs). Such converters may be for applications ranging from low voltage chips, to computers, locomotives and high voltage transmission lines. Converters may be used for example for switching in high voltage dc transmission lines of the type which may, for example, carry power from an offshore wind installation, and for medium voltage (for example greater than 1 kV) switching for motors and the like, for ex-ample locomotive motors.

The following description generally relates to driving one or more power switch(es), which in turn are configured for driving a load of a power converter. As the power switch(es), IGBTs are used for example to control large currents by the application of low level voltages or currents, some IGBTs having ratings of, e.g., 1200 V or 1700 V, and/or 1200 A. However, principles and embodiments described herein are generally applicable where the power switch(es) are instead a MOSFET such as a silicon carbide MOSFET (vertical or lateral), HEMT, JFET or other type. Thus, any mention of IGBT or power switch can generally be replaced with reference to any such device. Furthermore, the techniques we will describe are not limited to any particular type of device architecture and thus the power switching devices may be, for example, either vertical or lateral devices; they may be fabricated in a range of technologies including, but not limited to, silicon, silicon carbide or gallium nitride.

Nevertheless, the power semiconductor switching devices with which we are concerned typically have a current carrying capability of greater than 1 A and are operable with a voltage of greater than 100 V, for example devices that are able to carry currents of greater than 10 A, 50 A or 100 A and/or are able to sustain a voltage difference across the device of greater than 500 V or 1 kV.

A typical IGBT gate drive comprises the elements shown in FIG. 1. The gate drive logic comprises digital logic circuits reference to a 3V3 or 5 V power supply which receives an incoming signal (PWM) indicating when to switch the power switch (e.g., IGBT) ON and OFF. The gate drive logic creates signals (SOURCE and SINK) indicating when current is to be supplied to and removed from the power switch respectively. A level translation stage is typically required to drive the power switch over a wider voltage range, e.g., −10 V to +15 V. The output stage for driving an IGBT comprises transistors P and N channel MOSFETS (labelled PMOS and NMOS) or bipolar PNP and NPN transistors with a turn-ON resistor (Ron) and a turn-OFF resistor (Roff) which are chosen to match the characteristics of the power switch and/or load. The output stage transistors can handle high current and normally require a drive stage as the digital logic and level translation cannot provide enough current to turn them on and off directly.

An IGBT may be provided in a module preferably including the IGBT device and a commutation diode, i.e., freewheeling diode, in antiparallel. IGBT module manufacturers generally publish preferred gate resistance values for minimal losses. In the case of IGBT turn-on there is a trade-off between IGBT switching loss and diode reverse recovery loss. It is generally desired that any attempts to reduce the overall losses ensure that the diode stays within its safe operating area (SOA), which may be represented on a graph of voltage against current by a line of maximum power dissipation which is preferably not crossed. The diode may be damaged if the switching speed of the converter output circuit is too fast, for example. IGBT manufacturers generally optimise their products for minimal overall losses assuming a voltage source drive with resistance (resistive drive). For this reason it is desirable that any drive circuit (driver) is a resistive drive preferably with output (gate drive) resistance within an IGBT manufacturer's specified range.

To reduce conduction losses it is desirable for a power switch control terminal, e.g., the IGBT gate, to be held at the highest possible voltage when the device is on. Device datasheets usually state 15 V as the normal operating point with absolute maximum at 20 V. Silicon carbide (SiC) MOSFETs on the other hand are usually expected to be operated at 18 to 20 V with a higher absolute maximum. To make a universal gate drive it is desirable to be able to configure the gate voltage.

Most power semiconductors have a short-circuit withstand capability. This is a time (typically 10 s) during which the device can withstand excessive current without failure. It is desirable that the gate drive can detect this condition and turn-off the IGBT safely within this time. The time is usually specified at a particular gate voltage.

In order to achieve the 10 μs short-circuit rating, IGBT manufacturers often trade-off conduction losses or silicon area. In other words higher performance devices could be realised if the 10 s requirement was relaxed. Improved measurement and control circuits are desirable to give device manufacturers the opportunity to create higher performance devices that can still be protected under abnormal conditions.

An improved method of controlling voltage levels on a power switch control terminal is therefore desired, for example to provide advantages such as, inter alia, reduced cost, reliability, low circuit complexity, low component count, and/or lower power dissipation, etc.

For use in understanding the present invention, the following disclosures are referred to:

DE 10 2006 034 351 A1; and
"Advantages of Advanced Active Clamping", Power Electronics Europe, Issue 8 2009, pp. 27 to 29.

SUMMARY OF THE INVENTION

According to a first aspect of the present invention, there is provided a power switch driver for driving a control terminal of a power switch to drive a load, the power switch driver having a negative feedback circuit to control current delivered to the control terminal, the negative feedback circuit comprising: a current output circuit comprising at least one of a current source and a current sink, the current output circuit for providing a saud the current of the control terminal and configured to receive an output current control signal to control magnitude of the current provided by the current output circuit; a terminal voltage input circuit for receiving a voltage from the control terminal and to output an indication of said voltage; an amplifier coupled to amplify the terminal voltage indication to generate an amplifier output; and a reference voltage input circuit for receiving a reference voltage, comprising at least one resistor, the reference voltage input circuit coupled to a charge supply input of the amplifier, wherein the power switch driver is configured to generate the output current control signal dependent on the amplifier output, and wherein the power switch driver is configured to reduce the current provided by the current output circuit responsive to an increase in the voltage received by the terminal voltage input circuit.

In an embodiment, such a power switch driver may present a controlled output impedance to drive the power switch. Advantageously, such controlled output impedance may be considered to be an emulated resistance.

In embodiments, the at least one resistor may determine such an emulated resistance of the power switch driver. Specifically, the reference voltage and at least one (fixed, variable and/or programmable) resistor(s) may in an embodiment determine a supply or reference current (Iref) to the amplifier to be set. The reference current may for example be determined by a fixed reference voltage, e.g., 0 V or 3V3. Preferably (i.e., optionally), the impedance of the reference voltage input circuit is substantially (e.g., exactly) purely resistive. A resistive impedance may then be emulated by the power switch driver to effectively provide a resistive output impedance to the power switch control terminal.

The output impedance of the power switch driver may thus not be determined by an output component, e.g., fixed resistors such as Ron or Roff as shown in the arrangement of FIG. 1, but may be at least partially determined by component(s) such as resistor(s) on an input stage of the driver. Indeed, such fixed output resistors may not be necessary. Advantageously, power dissipation may thus be reduced and/or thermal constraints relating for example to board layout and/or number or choice of components, may thus be mitigated.

The component(s) of the reference voltage input circuit may be programmable and/or controllable by digital or analog means, to provide a variable reference impedance. For example, the at least one resistor may in embodiments comprise a digital resistor and/or controllable resistor network. Thus, an embodiment may be suitable for driving a wide range of power switches preferably with a wide range of (generally inductive) loads, advantageously without needing to change gate drive resistors according to power switch module and/or load characteristics, and/or requiring an operator to stock different power switch drivers for different power switches and/or loads.

Further regarding the emulation, the current delivered by the current output circuit is preferably reduced substantially (e.g., exactly or within, e.g., 1%, 2%, 5% or 10%) in proportion to the increase in the voltage received by the terminal voltage input circuit. The amplifier, considered in an embodiment to amplify the terminal voltage indication, may comprise a voltage buffer and/or current amplifier, the amplifier preferably having high input impedance and/or low output impedance. The charge supply input of the amplifier may be coupled to the reference voltage input circuit, the charge supply input in embodiments being referable to as a power, current or charge supply input. An embodiment may replicate the output current circuit, terminal voltage input circuit and amplifier (e.g., buffer, collector follower) arrangement for lower and higher voltage sides of the power switch driver. The reference voltage input circuit may be shared by the sides. In the lower voltage side, the output current circuit may comprise the current sink, whereas in the higher voltage side the output current circuit may comprise the current source. The skilled person will be aware of different ways of implementing the current source or sink, e.g., by means of a discrete solution or in an ASIC, either based on an operational amplifier for example.

The terminal voltage input circuit may present a high impedance to the control terminal. Such a high impedance may be, e.g., more than or equal to 10 kΩ, 100 kΩ, 1 ?O or 10 ?O. Preferably the high impedance is sufficient to limit current on the input of the terminal voltage input circuit so that current and/or voltage on the control terminal is substantially unaffected by the terminal voltage input circuit input impedance.

There may further be provided the power switch driver, wherein the terminal voltage input circuit has a coupling (e.g., one or more resistors in series) to the reference voltage input circuit, preferably to effectively increase the impedance presented to the control terminal by the terminal voltage input circuit. Such a coupling may further couple the terminal voltage input circuit to the amplifier.

There may further be provided the power switch driver comprising an offset voltage input circuit (e.g., comprising a comparator and/or buffer) having an input line (e.g., conductor such as a track, wire, connector and/or pin) to receive an offset voltage and comprising a comparator to compare an indication of the voltage of the terminal voltage input circuit to the offset voltage, the offset voltage input circuit preferably to allow a limit of variation of the voltage from the power switch control terminal to be set by the offset voltage when the power switch driver is operated to drive the power switch.

There may further be provided the power switch driver having a coupling switch to disable dependency of control of the amplifier on said voltage of the terminal voltage input circuit. The converter (e.g., specifically the power switch driver of the converter) may comprise a current detector for monitoring a current (which may be processed, e.g., averaged, to improve the monitoring output) through the load (and/or through the power switch driven by the driver) and configured to disable the dependency when the current detector indicates the monitored current below a threshold current, the power switch driver to provide a substantially (e.g. exactly, or within 5% or 10%) constant said current of the current output circuit when the dependency is disabled. Advantageously, such an embodiment may allow resistor emulation to be turned off to provide a constant drive current, thus preferably limiting a rate of change of dv/dt across a load. This may to some extent protect windings of inductive loads, e.g., of a motor.

Furthermore, the above-mentioned emulation may in such an embodiment be turned off for example at low load. Such disabling of the dependency when the monitored current is below the threshold current may for example effectively allow high emulated resistor at low load.

The power switch driver may be configured to increase (reduce) the current provided by the current output circuit responsive to a reduction (increase) in the voltage received by the terminal voltage input circuit. Such references to an increase or reduction of current or voltage may refer to magnitude only.

Similarly, it is noted that the current output circuit may be configured to receive an output current control signal to control magnitude and/or direction of the current provided by the current output circuit.

A power converter comprising the power switch driver may comprise at least one half bridge circuit comprising a series connection of a first power switch and a second power switch, the first and second power switches configured to alternately pass current for driving the load coupled to an output line of the half bridge circuit, each said power switch coupled in parallel with a diode, wherein the power converter comprises at least one said power switch driver to drive a respective said power switch, wherein the at least one resistor of the power switch driver comprises a controllable resistor (e.g., provided as a digital resistor and/or controllable resistor network), the power converter comprising: a turn-on detector to indicate at least a start of a turn-on period of increasing current through at least one of the power switches, wherein the power converter is configured to control the coupling switch of at least one said power switch driver based on the turn-on detector indication to allow the dependency of control of the amplifier of the driver on said voltage of the terminal voltage input circuit of the driver during the turn-on period. Thus, resistor emulation may be provided during a turn-on phase(s), optionally further a subsequent fully on period, of at least one said power switch.

In some circuit configurations the monitored current may be collector current of an IGBT for example ("collector current" generally referring herein to current through a power switch, e.g., may be current through the collector terminal of an IGBT or drain-source current of a MOS power switch). Considering the series connection, either or both of the first and second power switches may be replaced by multiple power switches in series. The diode (as for other diodes mentioned herein) may be a free-wheeling or commutation diode, preferably provided in a module with the corresponding power switch. Regarding the respective power switch driven by each power switch driver, one of the drivers may drive one or more power switches, another driver may drive another one or more power switches, etc.

The turn-on detector may be in the output line to the load and/or coupled to a main conduction terminal, e.g., collector or emitter, of the power switch. The turn-on detector may be a component of the driver, e.g., provided in driver module. The indication of the at least start of a turn-on period may be provided for example by the turn-on detector outputting an active signal (e.g., digital "1") while the rate of change of current remains above a threshold level. The increasing current through the power switch(es) may be detected by detecting when the current has a rate of change above a threshold rate of change value.

Preferably, the turn-on detector is configured to detect an increase in rate of change of the current through the at least one power switch and a subsequent decrease in the rate of change to indicate pendency of the turn-on period. The increase may be detected when the rate of change is beyond, e.g., above, a threshold. Similarly, the decrease may be detected when the rate of change is below a threshold.

The power converter may be configured to control the coupling switch of at least one said power switch driver to allow the dependency of control of the amplifier of the driver on said voltage of the terminal voltage input circuit of the driver during a period subsequent to (preferably immediately following) the turn-on period, the power converter configured to increase resistance of the controllable resistor of the driver at the start of the subsequent period. Such a subsequent period may be a fully-on period of the power switch. Thus, resistor emulation may be turned on and/or or output impedance increased or decreased, after the power switch(es) has turned on.

The power converter may be configured to control the coupling switch of at least one said power switch driver to disable said dependency of control of the amplifier of the driver on said voltage of the terminal voltage input circuit of the driver during a period subsequent to (e.g., immediately following) the turn-on period, the power converter to deliver a substantially constant said current of the current output circuit of the driver during the subsequent period.

There may further be provided the power converter, comprising a timing detector to indicate at least one of: a reversal of direction of rate of change (e.g., positive to negative, or vice versa) of the current through the at least one power switch at a start of the subsequent period; a decrease in the rate of change of the current through the at least one power switch at the end of the subsequent period (e.g., detected when the rate of change falls below a threshold); and a voltage across the power switch below (or above) a threshold value at the end of the subsequent period, the control of the coupling switch to control duration of said dependency responsive to at least one said indication. Such a timing detector may be provided in the output line to the load and/or coupled to a terminal (e.g., a collector or emitter) of the power switch. The detector may be a component of a power switch driver module.

There may further be provided a power converter having the power switch driver and comprising at least one half bridge circuit comprising a series connection of a first power switch and a second power switch, the first and second power switches configured to alternately pass current for driving the load coupled to an output line of the half bridge circuit, each said power switch coupled in parallel with a commutation diode, wherein the power converter comprises at least one said power switch driver to drive a respective said power switch, wherein the at least one resistor of the power switch driver comprises a controllable resistor, the power converter comprising: a timer circuit to measure duration of at least one phase of a switching cycle of the power switch, wherein the power converter (preferably the power switch driver of the converter) is configured to adjust resistance of the controllable resistor in response to at least one said measured duration. Such phase(s) may for example comprise turn-on phase(s), turn-off phase(s), fully on phase(s) and/or fully on phase(s). Such a switching cycle may comprise an ON (OFF) interval followed by an OFF (ON) interval of the power switch, the ON (OFF) interval comprising a turn-on(off) period and fully on(off) period.

There may further be provided a power converter for driving an inductive load comprising a winding, the power converter comprising at least one half bridge circuit comprising a series connection of a first power switch and a second power switch, the first and second power switches configured to alternately pass current for driving the load coupled to an output line of the half bridge circuit, wherein the power converter comprises at least one above-described power switch driver to drive a respective said power switch, wherein the at least one resistor of the power switch driver comprises a controllable resistor (e.g., digital resistor, controllable resistor network), the power converter comprising: a current detector for monitoring a current through the load, wherein the power converter is configured to increase the (overall) resistance of the controllable resistor of at least one said driver when the current detector indicates the monitored current below a threshold current.

Such an embodiment may be advantageous for protecting the windings of an inductive load, e.g., a motor. Preferably the embodiment will reduce a maximum rate of change of voltage across the load.

Considering particular arrangements, the series connection may comprise multiple first and/or second power switches in series. The monitored current may be an averaged load current, measured at the power switch(es) and/or at the load.

In an embodiment, the resistance of the controllable resistor of each power switch driver coupled to the half bridge circuit may be increased when the current detector indicates the current magnitude below threshold. Regardless, the increased resistance(s) in an embodiment may allow high emulated resistor at low load. Additionally or alternatively to the resistance increase, the power converter may decrease the resistance when the current detector indicates the monitored current above a threshold current.

There may further be provided the power converter, wherein the power switch driver coupled to drive the respective power switch comprises the current detector configured to monitor a current through the respective power switch, the power switch driver configured to increase the resistance of the controllable resistor of the power switch driver when the current detector detects the monitored current below the threshold current. Such an embodiment may allow local current measurement and/or emulated resistor control.

Additionally or alternatively, the power converter may be configured to increase the resistance of the controllable resistor substantially (exactly, or at least within e.g. ±2%, 5% or 10%) in inverse proportion (preferably linearly) to the monitored current.

The increase of the resistance may be for reducing rate of change of voltage on the output line during current commutation from at least one of said first and second power switches of the half bridge circuit. This may be used advantageously where at least one of the power switches has an antiparallel diode, such that the current commutation is between a power switch and a diode (e.g., from the first (second) power switch to a free-wheeling diode in parallel with the second (first) power switch). Some power switches are reverse conducting (consider, e.g. a GaN HEMT or MOSFET body diode) however, and a discrete or integrated diode may then not be required in antiparallel with such a power switch.

There may further be provided the power converter, comprising at least two said half bridge circuits, the power converter configured for driving the load by passing the current through the first power switch of a first said half bridge circuit and a second power switch of a second said half bridge circuit, the power converter configured to increase the resistance of the controllable resistor of at least one of the first power switch of the first half bridge circuit and the second power switch of the second half bridge circuit, said increase for damping a rate of change of voltage across the winding of the load. For example, the first power switch may be in an upper arm of a half bridge circuit (phase leg) and the second in a lower arm of another half bridge circuit (phase leg).

According to a second aspect of the present invention, there is provided a power converter comprising at least one power switch driver for driving a control terminal of a power switch to drive a load, the power converter comprising at least one half bridge circuit comprising a series connection of a first said power switch and a second said power switch, the first and second power switches configured to alternately pass current for driving the load coupled to an output line of the half bridge circuit, each said power switch coupled in parallel with a diode, wherein the at least one power switch driver is configured to drive a respective said power switch and the power converter comprises: at least one clamp comparator to compare an indicator of a variable of the power switch to a clamp value, wherein the power switch driver is configured to reverse a direction of current flow between the power switch driver and the control terminal of the power switch when the clamp comparator indicates that the power switch variable indicator exceeds the clamp value, wherein the power switch variable comprises at least one of: voltage across the power switch; rate of change of current through the power switch; and rate of change of voltage across the power switch.

In an embodiment, fast feedback may be provided from the power switch via a comparator to allow a control circuit, e.g., gate drive logic, to cause the power switch to be partially or fully turned off under certain condition(s). Such a condition may be detection that the power switch is operating at a maximum safe voltage or current. Thus, clamping, preferably without transorbs may be achieved in an embodiment.

In a standard drive, the reversal of direction of current flow between the power switch driver and the control terminal may be achieved by turning on an upper output stage switch (e.g., PMOS of FIG. 1) and turning off a lower output stage switch (e.g., NMOS of FIG. 1), or vice versa.

The power switch driver may however be for resistance emulation as described above. In this regard, and considering a power switch driver of the first aspect, the reversal of direction of current flow between the power switch driver and the control terminal may in an embodiment be achieved by changing the reference voltage, e.g., from 0 to 3, 3 V, for example to reverse gate current of the power switch in the form of an IGBT. Such a change of reference voltage may, in an embodiment having an upper arm having one of the first and second power switches and a lower arm having the other, turn off the lower arm (power switch) and/or turn on the upper arm (power switch). The clamp value need not have polarity, so that the comparison to indicate exceeding the clamp value may be a magnitude comparison.

The voltage across the power switch may be between the collector and emitter, or source and drain, of a power switch such as an IGBT or MOSFET. Similarly, such current through the power switch may be between the collector and emitter, or source and drain, of such a power switch. Thus, the variable of the power switch may be, e.g., Vce, dIc/dt or dVc/dt. Each diode may be a free-wheeling diode preferably provided in a module comprising the power switch, the power switch coupling to the diode being antiparallel. The series connection may comprise multiple first and/or second power switches in series.

There may further be provided the power converter, configured to perform said reversal when the clamp comparator indicates that the power switch variable indicator goes beyond or exceeds the clamp value during an OFF period of the power switch. Such an OFF period may comprise a turn-off period and/or a fully off period of the power switch. (Any reference to exceeding a clamp value may refer to magnitude of the power switch variable indicator exceeding magnitude of the clamp value).

There may further be provided the power converter comprising a capacitive impedance coupled across the power switch, preferably wherein the capacitive impedance comprises a potential divider having impedances in series across the power switch, a coupling of said series impedances configured to provide the indicator of voltage across the power switch, wherein each said series impedance comprises a capacitance. Such a potential divider may step the voltage down to a usable value, while the combination of resistance and capacitance allow the potential divider to have wide frequency response, for example compared to an embodiment having a potential divider comprising resistors alone. Thus, the capacitance(s) may improve the speed of the feedback to improve clamping control of an embodiment. Preferably, the series impedances have a constant ratio over the required bandwidth from DC to a high frequency beyond which the ratio may increase or decrease.

There may further be provided the power converter comprising: at least one limit comparator to compare an indicator of a variable of the power switch to a limit value, wherein the power switch driver is configured to, during each of a series of on-off switching cycles of the power switch: reduce a circuit variable if the limit comparator indicates that the power switch variable indicator remains less than the limit value during an OFF period of the power switch; and increase the circuit variable if the comparator indicates that the power switch variable indicator exceeds the limit value during an OFF period of the power switch, wherein the circuit variable comprises at least one of: a controllable output resistance of the power switch driver; and current to a control terminal of the power switch, and wherein the power switch variable comprises at least one of: voltage across the power switch; rate of change of current through the power switch; and rate of change of voltage across the power switch.

It is noted that a limit comparator and a clamp comparator may be implemented together as a single comparator in an embodiment.

An embodiment may allow feedback to maintain the power switch variable at, or close to (e.g., within 1%, 5% or 10%), the clamp value. Advantageously, clamping may be achieved with reduced, or substantially no, overshoot of the voltage across the power switch beyond the clamp value. This may be achieved in an embodiment by adjustment of an output resistor on a cycle-by-cycle basis until clamping according to the clamp value is achieved, e.g., the magnitude of the variable is less than a clamp value. In an embodiment, clamping based on the variable may ensure that the voltage across the power switch does not exceed the maximum voltage rating. Similar may apply to current in the power switch.

The voltage across the power switch may be between the collector and emitter, or source and drain, of a power switch such as an IGBT of MOSFET. Similarly, such current through the power switch may be between the collector and emitter, or source and drain, of such a power switch. Thus, the variable of the power switch may be, e.g., Vce, dIc/dt or dVc/dt.

The or each comparison to a clamp or limit value may be a magnitude comparison, i.e., so that polarity of the value, power switch variable and/or power switch variable indicator does not affect the output of any said comparison.

A switching cycle may comprise an ON (OFF) interval followed by an OFF (ON) interval of a power switch (an ON (OFF) interval comprising a turn-on(off) period and fully on(off) period). The OFF period may comprise a turn-off period and/or a fully off period. The series of switching cycles may comprise one, two or more such cycles.

The current to the control terminal, e.g., gate, of the power switch such as an IGBT, is preferably a substantially constant current, albeit adjustable.

There may further be provided the power converter, wherein the circuit variable comprises the controllable output resistance and the power switch driver comprises an output stage comprising a series connection of a control switch and a controllable resistor having the controllable output resistance, the series connection for bleeding, e.g., sinking, a current of the control terminal, the current for turning the power switch off.

The series connection of the control switch and controllable resistor may comprise for example a n-type MOS (or p-type in an alternative embodiment) and controllable resistor. The series connection of the control switch and controllable resistor may be in the lower or upper arm of an output stage. The controllable resistor may comprise a digital resistor and/or controllable resistor network.

In an embodiment of the power converter, the power switch driver is an adaptive drive. Specifically, the power switch driver may be as defined above for the first aspect, wherein the circuit variable comprises the controllable output resistance and the power switch driver is configured to adjust resistance of the at least one resistor to perform at least one of said increase and decrease of the circuit variable.

Additionally or alternatively, the current to the control terminal may be the current provided by the output circuit. The power switch driver may comprise a coupling switch as defined above for an embodiment of the first aspect.

Thus, a resistor emulation gate drive may further allow clamping preferably with reduced overshoot of the voltage across the power switch beyond the clamp value.

In an embodiment wherein the power converter has a DC link, i.e., voltage across phase leg(s), this may be monitored to similarly reduce clamping-related voltage overshoot. Such a converter may be for AC-AC, AC-DC, DC-DC or DC-AC conversion. ("Converter" as mentioned herein generally encompassing a DC to AC inverter, AC to DC rectifier, and/or DC-DC or AC-AC voltage level converter, etc.). The DC link may be provided for example where each of multiple phase legs of a half-bridge based converter circuit has an upper arm having power switch(es) in series and a lower arm power switch(es) in series, a junction between the arms coupled to drive a load. The DC link may act to stabilise the voltage in common across the phase legs.

Specifically, the power converter may have at least two phase legs and a DC link coupled across each of the phase legs to have a voltage in common to the phase legs, wherein the power switch driver comprises: an output stage providing a controllable output resistance, the output stage for conducting a current of the control terminal, the current for turning the power switch off; a feedback line to receive an indicator of the voltage in common (e.g., based on collector voltage of a power switch); and a drive stage controller coupled to the feedback line and configured to control of the controllable output resistance based on the voltage indicator received on the feedback line.

The drive stage controller is preferably configured to increase (decrease) the controllable output resistance when the voltage indicator indicates an increase (decrease) in said voltage in common. Additionally or alternatively, the drive stage controller may be configured to increase (decrease) the controllable output resistance when the voltage indicator indicates the voltage in common above (below) a threshold link voltage value (such voltage above (below) being preferably considered merely as a voltage magnitude). It is noted that the indicator may indicate an increase, beyond and/or above, threshold value, of average DC link voltage. Thus, the controllable output resistance may be changed at a reduced frequency, e.g., at least not every switching cycle.

Preferably, a central controller is provided for controlling a plurality of power switch drivers, the central controller comprising the drive stage controller.

In an embodiment, the power switch driver comprises an output stage comprising a series connection of a control switch and a controllable resistor having the controllable output resistance.

The power switch driver may be an adaptive drive, wherein the controllable output resistance may be emulated by a current source or sink. Where the power switch driver is as defined above for the first aspect, the output stage may comprise the current output circuit, and the power switch driver be configured to adjust resistance of the at least one resistor to perform the control of the controllable output resistance.

When provided as a product, the power converter may comprise the power switch driver and DC link.

It is noted that any power converter of any above aspect may be provided comprising the power switch driver of any of the above aspects.

Furthermore, any power switch driver or power converter as described above may be provided, wherein the power switch comprises an IGBT (preferably including an antiparallel diode, i.e., a so-called free-wheeling diode, optionally in the same module as the IGBT), a MOSFET such as a silicon carbide MOSFET, a HEMT or JFET, or other type of power switch. Any of these switches may be based on silicon carbide, gallium nitride or silicon technology.

According to a third aspect of the present invention, there is provided a power switch driver for driving a control terminal of a power switch to drive a load, the power switch driver comprising: a controllable voltage source to provide a control terminal reference voltage; a voltage control circuit for controlling voltage on the control terminal of the power switch according to the control terminal reference voltage, the voltage control circuit configured to provide an output signal to vary the voltage on the control terminal; and a feedback circuit to generate a signal indicating a rate of change of at least one of a current or voltage of the power switch and to, in response to said signal indicating a reduction of impedance of an output circuit of the power switch driver, control the controllable voltage source to reduce the control terminal reference voltage, said reduction to reduce the controlled voltage.

The output circuit may comprise at least the said power switch (e.g., in one upper or lower arm of a phase leg of a bridge circuit; other power switches of the output circuit may be comprised in that or another arm of the phase leg) and optionally at least one commutation diode in antiparallel with a power switch, and/or the (generally inductive) load. Such a diode may be in antiparallel with the power switch having the controlled control terminal voltage, and/or with a power switch in series with the power switch having the controlled voltage, for example a power switch in another arm of a phase leg having the power switch having the controlled voltage.

In an embodiment, a short circuit condition of the output circuit may occur if a load terminal (generally a midpoint between upper and lower arms of a half bridge circuit or phase leg) becomes connected to a power rail, for example if one or more power switch(es) and/or diode(s) fails or the load becomes shorted to a power rail. Where such a short-circuit condition occurs, voltage on the above power switch control terminal is preferably to be reduced.

The reduction of impedance, e.g., resistance, of the output circuit, may represent a sudden and/or abnormal reduction in the impedance. An embodiment may be applied to protect the power switch, e.g., IGBT, by reducing the voltage on the control terminal (e.g., gate) when current through the power switch increases, while allowing lower power dissipation under safer operating conditions. Thus, the reduction of the controlled voltage may occur upon detection of a potential short-circuit condition of the output circuit during operation of the power switch at a boosted control terminal voltage. Such voltage reduction may reduce the extent to which the power switch is turned on. Advantageously, the power switch may then operate at a safe voltage, e.g., at a control terminal voltage below the manufacturer's recommended normal operating voltage.

A specific embodiment may for example monitor rate of change of current through the power switch, e.g., by detecting voltage across a (preferably stray) inductance, for example inductance of an IGBT Kelvin emitter, in order to indicate the said rate of change. The controllable voltage source may comprise a digital-to-analog converter (DAC). The control of voltage on the control terminal may comprise controlling current of a current sink or source providing current to/from the control terminal. Thus, the output signal may be a current signal.

It is noted that the references to reduction of control terminal reference voltage and/or controlled voltage may refer only to magnitude of the voltage(s).

The voltage control circuit may comprise a gate voltage feedback circuit configured to control an output stage of the power switch driver dependent on the control terminal reference voltage and an indicator of voltage on the control terminal, the output stage configured to control the reduction of controlled voltage according to an output of the gate voltage feedback circuit. Such an output stage may comprise a current source or sink, or may comprise a controllable resistor (e.g., variable and/or programmable Roff or Ron) and/or a control switch (e.g., NMOS or PMOS). Such a controllably output resistor may replace the fixed output resistor of a standard gate drive such as is shown in FIG. 1. The gate voltage feedback circuit may comprise a comparator to receive a first input depending on the control terminal reference voltage and/or control terminal voltage, and a second input to receive a bias signal, the output of the comparator to control the output stage. An amplifier and/or voltage buffer may further be provided to forward the comparator to a drive stage, e.g., resistor emulation stage, to control the drive output stage and thus control terminal voltage.

Thus, a gate voltage feedback circuit may control terminal voltage based on a control terminal reference voltage, an indicator of the control terminal voltage and/or a signal indicating an output stage impedance reduction.

There may further be provided the power switch driver, comprising: an input line to receive a turn-on signal to instruct turn-on of the power switch, wherein: the voltage control circuit is configured to, in response to the turn-on signal, raise the voltage on the control terminal to a boost voltage; and said reduction of the controlled voltage is a reduction from the boost voltage. The raising the voltage may occur immediately, or at a preferably (i.e., optionally) predetermined delay, after the turn-on signal. The boost voltage is preferably a higher voltage than the normal operating point of the power switch (e.g., as indicated in a manufacturer's datasheet). The boost voltage is similarly desired to be lower than the maximum safe voltage of the power switch (e.g., as indicated in a manufacturer's datasheet). The input line (comprising, e.g., a track, wire, connector and/or pin, etc.) may receive the turn-on signal in the form of an edge of a pulse width modulation signal.

The feedback circuit may comprise a comparator to receive the signal indicating the rate of change and to compare the received signal to a threshold, e.g., threshold value, the comparator configured to output a result of the comparison to provide the indication of reduction of impedance.

The voltage control circuit may be configured to, in response to the turn-on signal, control the output signal to generate a first voltage on the control terminal of the power switch, the voltage control circuit configured to further control the output signal to generate the second, boost voltage on the control terminal of the power switch at a time delay after the first voltage is generated. The first voltage is preferably sufficient to turn the power switch on. The boost voltage may turn the power switch on to a harder, or lower loss, state compared to that of the first voltage. In embodiment, this may mean that the power switch control terminal is raised to its normal operating voltage before it is boosted. The time delay may be for ensuring that the power switch has not turned on into a short circuit. For example, the time delay may be a few microseconds, e.g., 5 to 7 μs.

The reduced control terminal reference voltage below the boost voltage may have the same voltage level as the first voltage, though more preferably is less (in magnitude) the first voltage. This may mean that the voltage of the power switch control terminal is pulled back to the normal operating voltage, or lower, when a short-circuit condition of the output circuit is detected. The power switch may thus be pulled back to a safer and/or higher loss state.

Further in this regard, the reduced control terminal reference voltage preferably maintains the power switch on. In such an embodiment, while the boost voltage may have been temporary, the power switch may remain on after the reduction from the first voltage.

The feedback circuit may be configured to, at a (preferably predetermined) time delay after the control to reduce the control terminal reference voltage, control the controllable voltage source to reduce the control terminal reference voltage to turn the power switch off. Thus, the control terminal reference voltage may be turned off in stages from the boost voltage via a reduced, preferably recommended normal, operating voltage.

In a preferred embodiment, the power switch driver may be combined with an adaptive drive. An adaptive drive advantageously comprises a circuit for impedance emulation, e.g., resistor emulation, rather than using a fixed or variable output stage resistor for example.

The power switch driver may have a negative feedback circuit to control current delivered to the control terminal, the negative feedback circuit comprising: a current output circuit comprising at least one of a current source and a current sink, the current output circuit for providing the current of the control terminal and configured to receive an output current control signal to control magnitude of the current provided by the current output circuit; a terminal voltage input circuit for receiving a voltage from the control terminal and to output an indication of said voltage; an amplifier coupled to amplify the terminal voltage indication to generate an amplifier output; and a reference voltage input circuit for receiving a reference voltage, comprising at least one resistor, the reference voltage input circuit coupled to a charge supply input of the amplifier, wherein the power switch driver is configured to generate the output current control signal dependent on the amplifier output, and wherein the power switch driver is configured to reduce the current provided by the current output circuit responsive to an increase in the voltage received by the terminal voltage input circuit.

In an embodiment, such a power switch driver may present a controlled output impedance to drive the power switch. Advantageously, such controlled output impedance may be considered to be an emulated resistance. Specifically, one or more of a fixed, variable and/or programmable resistor(s) may in an embodiment allow a supply or reference current (Iref) to be set to the amplifier, the reference current further depending on a fixed reference voltage (e.g., 0V or 3V3). Preferably, impedance of the reference voltage input circuit is substantially (e.g., exactly) purely resistive. A resistive impedance may then be emulated by the power switch driver to effectively provide a resistive output impedance to the power switch control terminal.

In embodiments, the at least one resistor may therefore determine an emulated resistance of the power switch driver.

The amplifier, considered in an embodiment to amplify the terminal voltage indication, may comprise a voltage buffer and/or current amplifier, the amplifier preferably having high input impedance and/or low output impedance. The reference voltage input circuit may be coupled to the charge supply input of the amplifier, the charge supply input in embodiments being referable to as a power, current or charge supply input.

The output impedance of such a power switch driver may thus not be determined by an output component, e.g., a fixed resistance such as Ron or Roff as shown in the arrangement of FIG. 1, but may be at least partially determined by component(s) such as resistor(s) on an input stage of the driver. Indeed, such output resistors may not be necessary. Power dissipation may be reduced and/or thermal constraints relating for example to board layout and/or number or choice of components, may be mitigated.

The component(s) of the reference voltage input circuit may be programmable and/or controllable by digital or analog means, to present variable impedance. For example, the at least one resistor may in embodiments comprise be at least one a digital resistor and/or controllable resistor network. Thus, an embodiment may be suitable for driving a wide range of power switches preferably with a wide range of (generally inductive) loads, advantageously without needing to change gate drive resistors according to power switch module and/or load characteristics, and/or requiring an operator to stock different power drives for different power switches and/or loads.

Further regarding the emulation, the current delivered by the current source is preferably reduced substantially (e.g., exactly or within, e.g., 1%, 2%, 5% or 10%) in proportion to the increase in the voltage received by the terminal voltage input circuit.

The power switch driver may comprise a coupling switch to disable dependency of control of the amplifier on the terminal voltage input circuit. Similarly, a coupling switch may be provided to enable dependency of control of the amplifier on the control terminal reference voltage. Thus, resistor emulation may be disabled while the driver is operated in a gate boost mode.

The power switch driver may be configured to monitor voltage across an inductance (e.g., preferably stray, inductive part of a terminal of the power switch module) to provide the signal indicating the rate of change of current of the power switch. For example, the inductance may be of a Kelvin emitter terminal of an IGBT module.

The power switch driver may comprise the power switch (optionally with commutation diode) and/or the load.

It is noted that a power switch driver as described above may comprise the power switch. Similarly, a power converter may be provided comprising a power switch driver as described above.

Furthermore, any power switch driver or power converter as described above may be provided, wherein the power switch comprises an IGBT (preferably including an antiparallel diode, i.e., a so-called free-wheeling diode, optionally in the same module as the IGBT), a MOSFET such as a silicon carbide MOSFET, a HEMT or JFET, or other type of power switch. Any of these switches may be based on silicon carbide, gallium nitride or silicon technology.

According to a fourth aspect of the present invention, there is provided a method for controlling a drive signal to a control terminal of a power switch to drive a load, comprising: in response to a turn-on signal, controlling the drive signal to generate a boost voltage on the control terminal, the boost voltage to turn the power switch on; when the voltage on the control terminal is the boost voltage, monitoring at least one of current and voltage of the power switch to detect a reduction in impedance of an output circuit comprising the power switch; and reducing the voltage on the control terminal below the boost voltage when the monitored current or voltage indicates the reduction of impedance.

Similarly as for the third aspect, the reduction of impedance, e.g., resistance, of the output circuit, may represent a sudden and/or abnormal reduction. An embodiment may be applied to protect the power switch, e.g., IGBT, by reducing the voltage on the control terminal (e.g., gate) when current through the power switch increases, while allowing lower power dissipation under safer operating conditions. Thus, the reduction of the controlled voltage may occur upon detection of a potential short-circuit condition of the output circuit during operation of the power switch at a boosted control terminal voltage. Such voltage reduction may reduce the extent to which the power switch is turned on, in an embodiment turning the power switch off. Advantageously, the power switch may then operate at a safe voltage, e.g., at a control terminal voltage below the manufacturer's recommended normal operating voltage.

Further similarly, the output circuit may comprise at least the said power switch (e.g., in one upper or lower arm of a phase leg of a bridge circuit; other power switches of the output circuit may be comprised in that or another arm of the phase leg) and optionally at least one commutation diode in antiparallel with a power switch (as described above for the third aspect), and/or the load. In an embodiment, a short circuit condition may occur if a load terminal (midpoint between upper and lower arms of a half bridge circuit or phase leg) becomes connected to a power rail, for example if one or more power switch(es) and/or diode(s) fails or the load becomes shorted to a power rail. Where such a short-circuit condition occurs, voltage on the above power switch control terminal may be reduced.

An embodiment may be applied to protect the power switch, e.g., IGBT, by reducing the voltage on the control terminal (e.g., gate) when current through the power switch increases, while allowing lower power dissipation under safer operating conditions. Advantageously, the power switch may then operate at a safe voltage, e.g., at a control terminal voltage below the manufacturer's recommended normal operating voltage.

Preferably, the voltage reduction reduces the extent to which the power switch is turned on. Thus, the reduction may immediately turn the power switch off, more preferably however may maintain the power switch on at a reduced control terminal voltage. The reducing the voltage below the boost voltage may comprise reducing the voltage to the first voltage, or less than the first voltage, e.g., may fully turn off the power switch.

The controlling the drive signal to generate the boost voltage may comprise: in response to the turn-on signal, controlling the drive signal to generate a first voltage on the control terminal, the first voltage to turn the power switch on; and at a time delay after said turn-on signal, further controlling said drive signal to generate a second voltage on the control terminal, wherein the second voltage is the boost voltage, said further controlling to turn the device on to a lower loss state. The generation of the first and/or second voltage may result in a step change relative to the first voltage, or may be done gradually and/or in multiple steps. The time delay may be for ensuring that the power switch has not turned on into a short circuit. For example, the time delay may be a few microseconds, e.g., 5 to Preferably, the time delay expires when a voltage on or across the power switch (e.g. collector or collector-emitter voltage) falls below a threshold value. To provide such a time delay, the driver may be configured to wait until the voltage falls to the normally on state (e.g., voltage on or across the power switch is 1 to 4 V). This may ensure that the device has not turned on into a short circuit. A suitable threshold value may be, e.g., 5 V, 10 V or In an embodiment, the power switch may be turned off at a time delay after said reducing the voltage on the control terminal below the boost voltage, preferably wherein said time delay is a preset time delay. Alternatively, the expiry of the time delay may be determined by comparison of a threshold value to at least one of a voltage signal and current signal of the power switch (e.g., collector current or voltage, or rate of change thereof; references herein to "collector" or "emitter" being replaceable by "source" or "drain" depending on the power switch). For some power switches (e.g., some types of IGBT), it may be desirable to wait for the power switch collector current to stop rising to determine the time delay. Detection of a positive di/dt below a threshold may allow the end of the power switch rise to be detected. Additionally or alternatively, the time delay may be determined by detecting when the voltage across the power switch has risen beyond, e.g., above, a threshold indicating desaturation.

Consistent with the above, the monitoring may comprise monitoring rate of change of current through the power switch. The monitored rate of change of current may be compared to a threshold value to provide the indication of reduction of impedance.

Further in this regard, the monitoring may be to detect a short-circuit condition of the output circuit comprising the power switch and optionally a load coupled to an output of the power switch. The output circuit may further comprise a commutation diode coupled in antiparallel with a power switch.

Preferred embodiments are defined in the appended dependent claims.

Any one or more of the above aspects and/or any one or more of the above optional features of the preferred embodiments may be combined, in any permutation. Furthermore, method(s) may be provided corresponding to any of the above apparatus, and apparatus may be provided corresponding to any of the above methods.

BRIEF DESCRIPTION OF THE DRAWING

For a better understanding of the invention and to show how the same may be carried into effect, reference will now be made, by way of example, to the accompanying drawings, in which.

SPECIFIC DESCRIPTION OF THE INVENTION

The following describes concepts and related embodiments, such as e.g.:

a circuit for an emulated resistor, showing how a current source may be used with feedback to control the effective resistance;

gate boost to reduce conduction losses including detection of high di/dt for protection under abnormal conditions;

method and apparatus for controlling dv/dt by measuring time in certain states and altering the resistance to keep constant;

adaptive scheme for allowing high DC link voltage, clamp levels and algorithm;

a current source that behaves like a resistor (which may be disabled when in gate voltage feedback mode);

a gate voltage feedback loop with device protection under short circuit;

a method for controlling dv/dt by measuring load current and adapting the drive characteristics; and a method for preventing overvoltage by selecting appropriate resistors in a control loop depending on DC link voltage, feedback from a voltage measurement, dv/dt measurement and/or di/dt measurement.

Any one or more of the above may be achieved and/or implemented in a single embodiment. Thus, a single product that can address multiple power switching applications may be provided.

Emulation

In a typical implementation, Ron and Roff are physical resistors. In some instances it is desirable to be able to change the resistors without soldering. It may therefore be advantageous to make the resistors programmable so that the resistors can be changed under software control, either statically or dynamically during operation.

One way to achieve this, now conceived of by the present inventors while devising the invention claimed herein, is to replicate the level translation, drive and output stages a number of times. Ron and Roff resistors can then be combined in different combinations to select various resistances. With N resistors there are $2^N-1$ combinations of resistors, e.g. 8 output stages would allow 255 different resistor settings.

Figure 2:
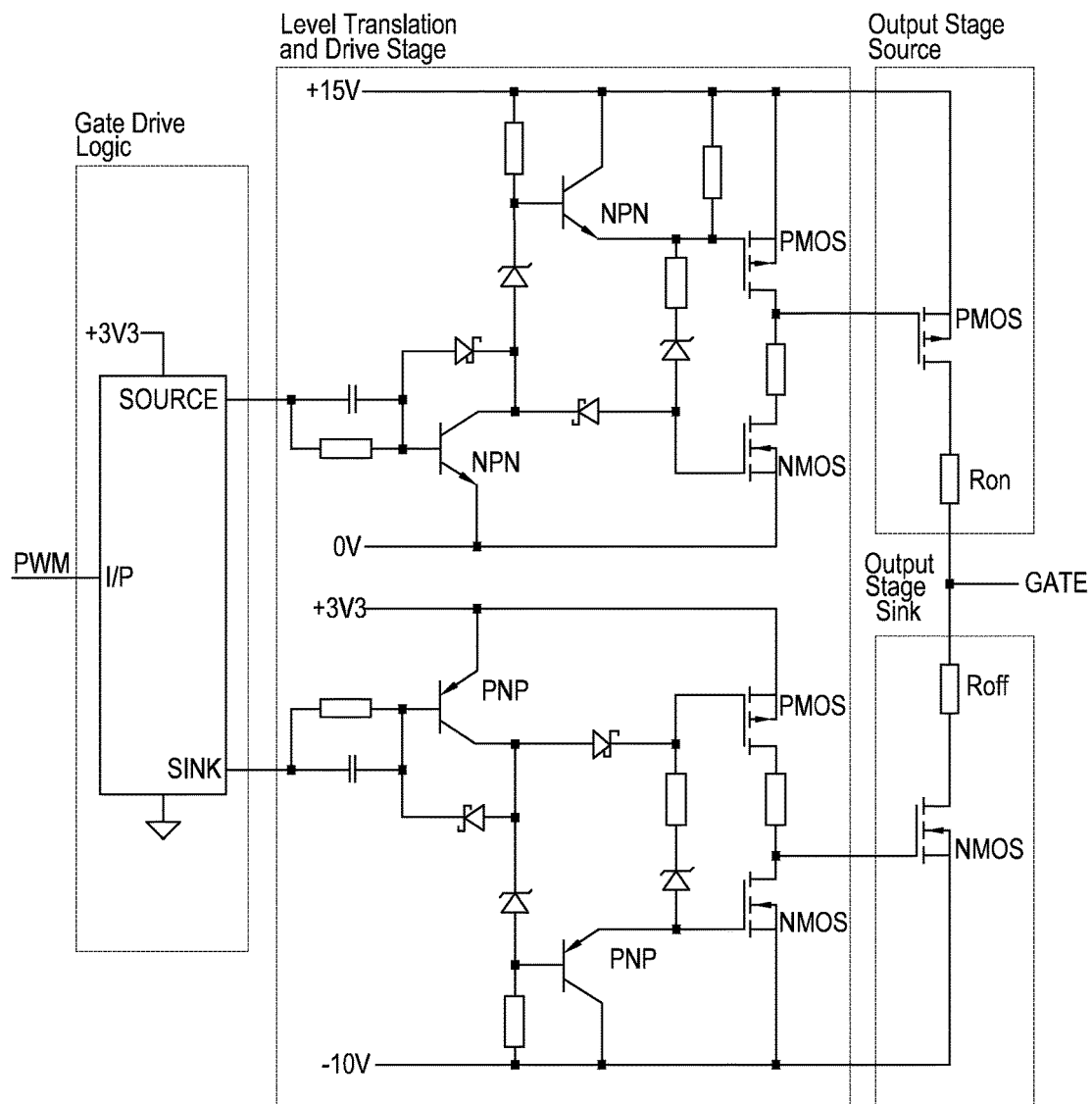
FIG. 2 shows an exemplary drive stage of an IGBT gate drive.

An arrangement now conceived of by the present inventors is shown in FIG. 2 where the level translation and drive stages are combined, and the output stage has been separated into source and sink blocks. (Note that the source and sink parts of the circuit are complementary. Other circuit diagrams provided herein may just show either the sink or source part).

This approach may be desirable in circumstances; however there may be a number of disadvantages. First a very large number of components may be required to provide a reasonable (>10) set of resistor values and this may lead to excessive board area. Also, power dissipation in the output stage transistors and resistors may not be evenly distributed across all components, as some may be permanently OFF in a particular implementation. This leads to over-rating components which may in turn lead to increased board area and/or cost.

Another approach is to replace each of Ron and Roff with a digitally programmable resistor. However, while such parts exist, they are generally not suitable in this context as they may need to be able to handle pulsed currents and high power dissipation.

Power dissipation and/or thermal performance may thus be of concern regarding resistive drive designs, bearing in mind for example that control of the ambient environment, e.g., by providing a fan, is generally not possible and/or desirable (for example due to cost). Similarly, mitigating high power dissipation by monitoring of temperature and/or derating a circuit, e.g., by limiting switching speeds, may be undesirable from the point of view of, inter alia, cost and/or converter performance.

As discussed above with reference to FIGS. 1 and 2, in some instances it may be desirable to be able to change the output stage resistances of a gate drive circuit without soldering. Preferably this is done while allowing for, e.g., good power conversion and/or thermal performance of a power converter.

Figure 3:
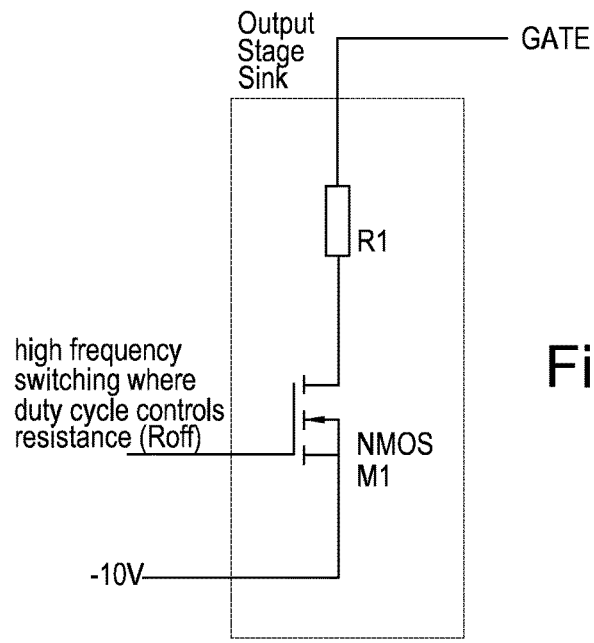
FIG. 3 shows a modulation of output transistor to change apparent resistance.

An addition or alternative to the digitally programmable resistor or replicated stages as discussed above is to turn the output stage transistors ON an OFF (e.g., switch them in and out of the circuit) with a varying duty cycle as shown in FIG. 3. (This idea is similarly now conceived of by the present inventors). The turn-OFF resistor value (Roff) is proportional to R1 and the duty cycle of the transistor M1. For this to be effective the modulation frequency of M1 is preferably high (>1 MHz) and suitable to smooth the current flowing into and out of the power switch; some inductance may be required. Generally, high frequency leads to high switching power dissipation in M1 and extra inductance may limit the speed at which the control terminal (e.g., gate) current can be changed, which is undesirable in some control applications.

Figure 4:
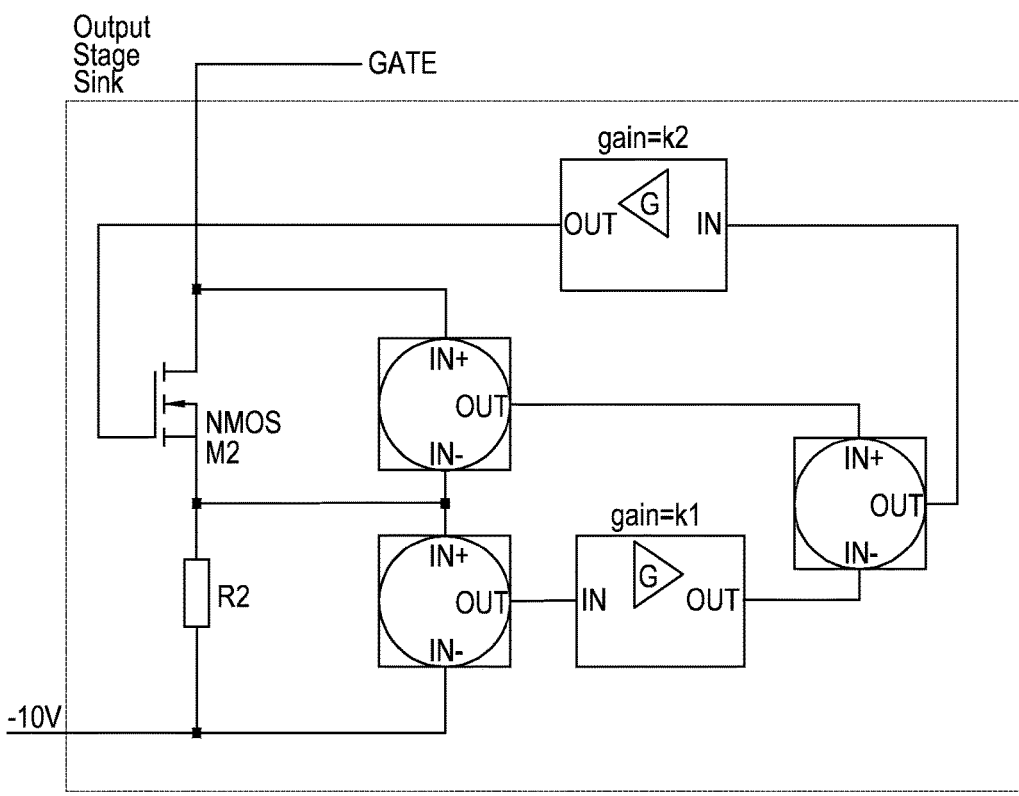
FIG. 4 shows that resistor behaviour may be copied to the output transistor.

A further development of this idea is shown in FIG. 4. In this case a fixed resistor R2 is used so that the output stage has the characteristics of a resistor. However the variable resistance is created by driving transistor M2 in its linear region so that its resistance is a multiple of R2. The voltage drop across R2 is R2*control terminal current. This voltage is measured and then passed through an amplifier with gain k1. This is compared to the voltage measured across M2. M2 is driven with an amplifier of gain k2. A feedback control loop is created which in its steady state ensures that the voltage drop across M2 is the multiple of k1 and the voltage drop across R2. Therefore, in this case Roff is equal to R2*(1+k1).

Such a circuit may be desirable in circumstances. However, one potential disadvantage of this circuit is that a variable gain amplifier (k1) may be needed, and this may be difficult to implement and drive from digital logic.

Figure 5:
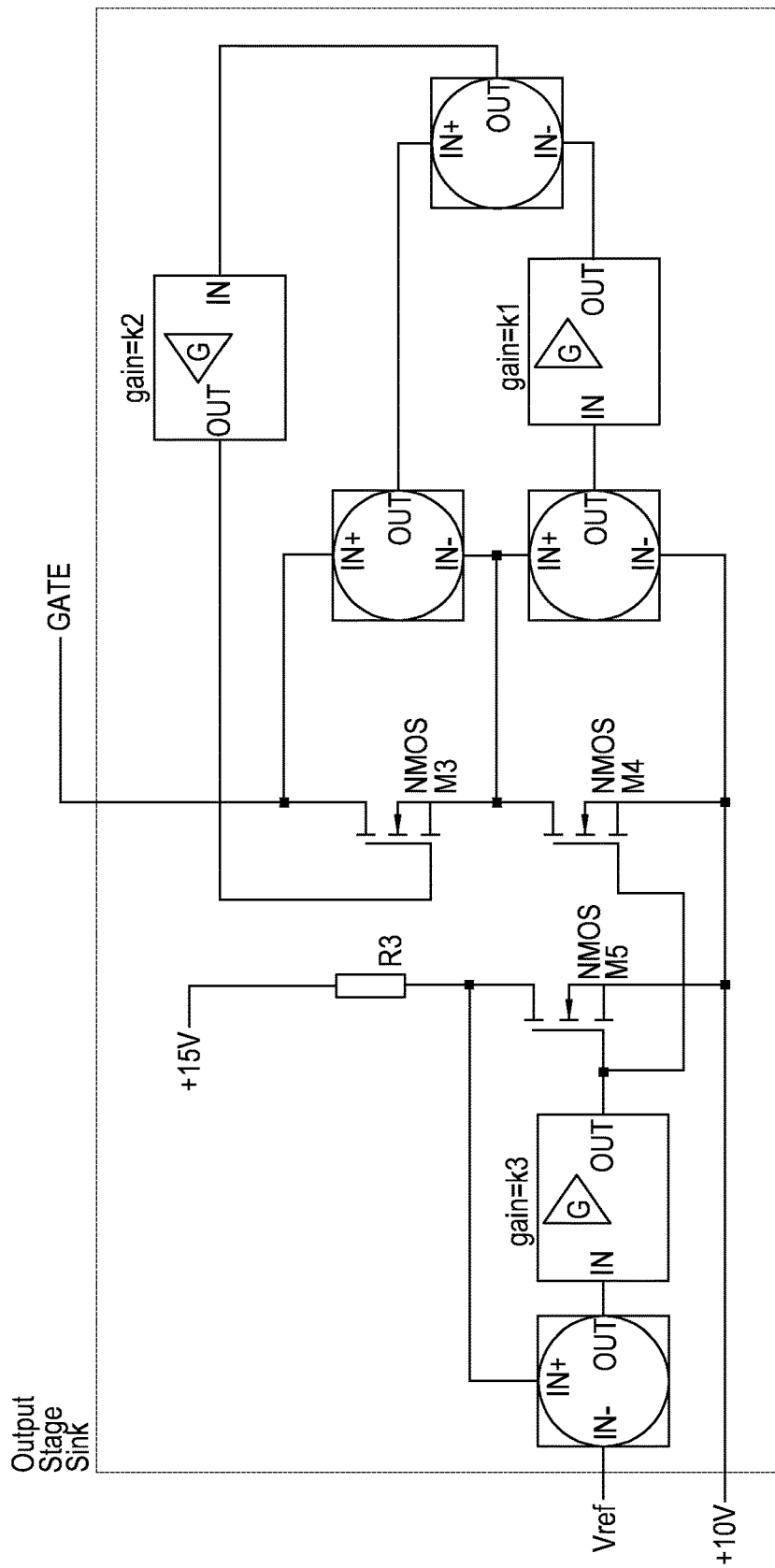
FIG. 5 shows a current mirror that may be used to set variable resistance.

A modification of FIG. 4 is shown in FIG. 5. Here, R2 is replaced by transistor M4 with a further transistor M5 used to set its resistance. Preferably M4 and M5 are copackaged so they have the same characteristics and as M4 and M5 share a common gate connection, the resistances of M4 and M5 are equal. The voltage drop across M5, and therefore its resistance, is set by an input voltage reference (Vref) which can be driven from logic levels. In this design, gains k1, k2 and/or k3 can be fixed. However the circuit uses a number of expensive operational amplifiers and depends on good matching of M4 and M5 for accuracy.

Figure 6A:
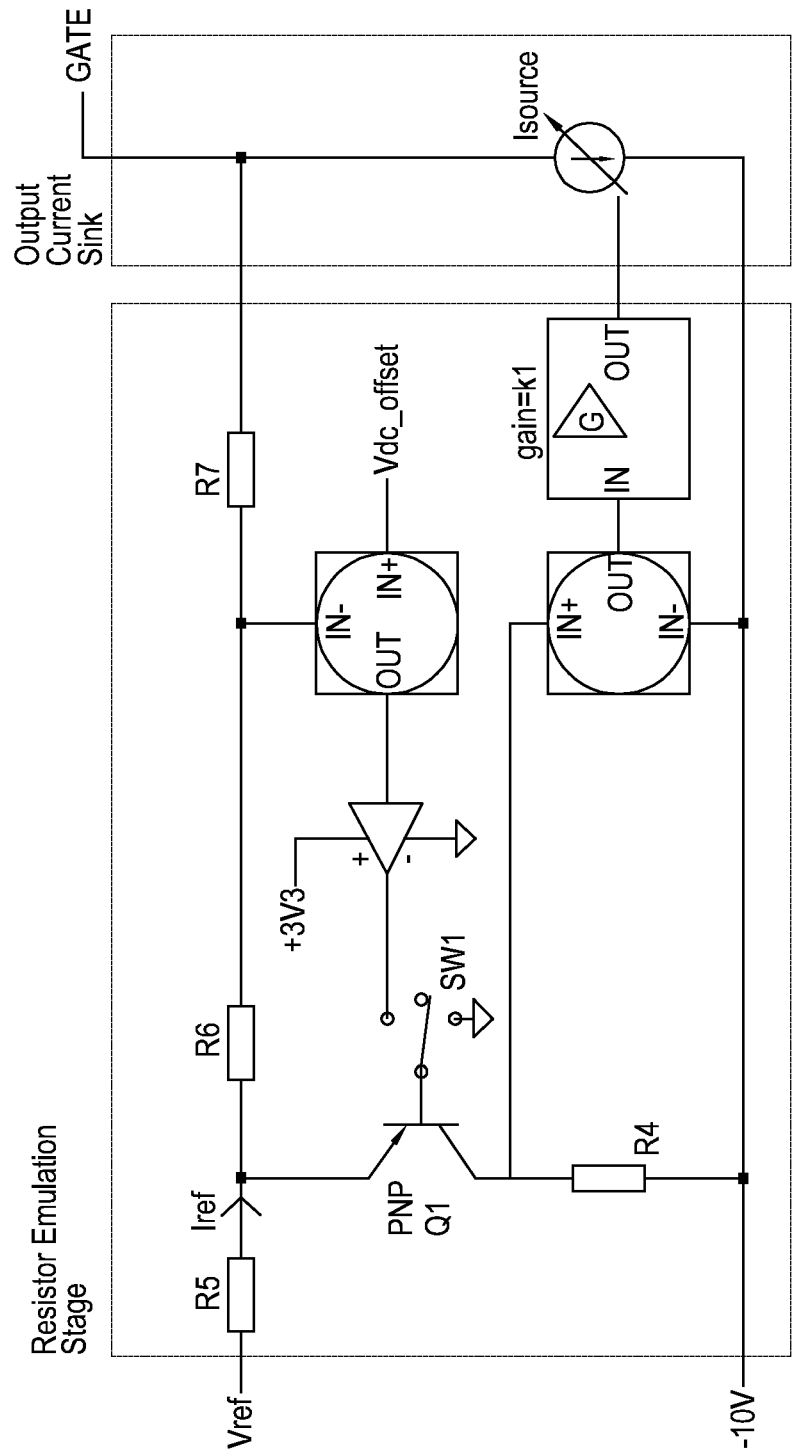
FIG. 6a shows an adaptive drive comprising an output current sink (labelled for ease of representation Isource) and resistor emulation stage; this may form a lower voltage side of a power switch drive.
Figure 6B:
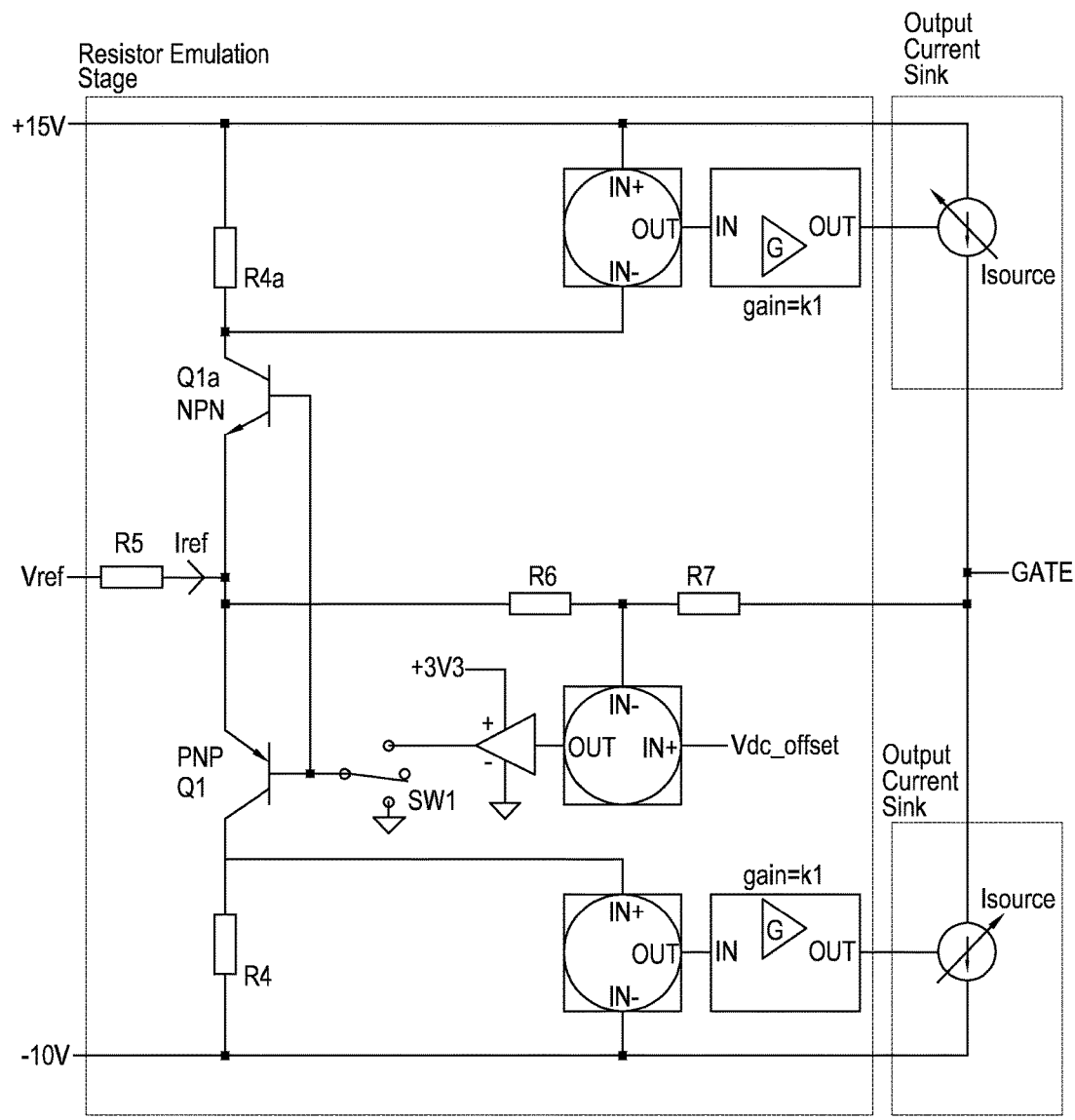
FIG. 6b shows an adaptive drive comprising upper and lower voltage sides.

A preferred approach is however a power switch driver in the form of an "adaptive drive" as shown for example in FIG. 6a or 6b. An adaptive drive advantageously comprises a circuit for resistor emulation, rather than using a fixed or variable output stage resistor. In the example circuit of FIG. 6a or 6b, this is generally achieved by using a current source to provide a control terminal current that is equivalent to the current flowing through a resistor. The reference voltage (Vref) is provided by digital logic. The reference voltage input can be at 0 V, logic level high (e.g. 3V3) or open circuit for example. The reference voltage input circuit receiving reference voltage Vref may comprise resistor R5 used to select the resistance desired to be emulated. A logic high voltage on Vref causes current Iref to flow through R5, Ω1 and R4. At least Ω1 and R4 may be considered as providing an amplifier with the amplifier output being considered as current through, or voltage across, R4. (The amplifier may have a standard configuration, e.g., of a buffer and/or collector follower). In FIG. 6a or 6b, the emitter of Ω1 may be considered to be a charge supply input of the amplifier. Note that R6 and R7 may have significantly higher impedance (e.g. 50×) compared to R5, R4 and the on resistance of Ω1, so that no appreciable current flows in this path. R6 may be considered as a coupling between the terminal voltage input circuit and the reference voltage input circuit. The voltage measured across R4, amplified with gain (k1), is used to set the current level of a current output circuit such as a current source (Isource; in another embodiment the current level of a current sink may be set instead). In one implementation k1 is set so the ratio of Iref to Isource is 1:250, but various combinations of gain and source/sink current could be chosen to match the requirements of different power switches. The output of the amplifier with gain k1 may be considered in an embodiment to be an output current control signal.

The voltage at the control terminal varies over a range of, e.g., −10 V to +15 V for a power switch such as an IGBT. In a resistive drive, the control terminal current may be proportional to the difference between the supply voltage and the control terminal voltage. In other words, during turn-ON, as the control terminal (gate) voltage gets closer to +15 V the current reduces to zero. Regarding a terminal voltage input circuit, R6 with/without R7 may be used to measure the control terminal voltage. As the voltage at the node between R6 and R7 increases the transistor Ω1 is driven so that the current in R4 is reduced in proportion. This may in turn reduce the control terminal current in a way that emulates the behaviour of a resistor. Thus a negative feedback loop for allowing an output current source/sink to emulate a resistor may be formed.

Regarding an offset voltage input circuit preferably comprising the comparator and buffer leading to SW1 as shown in FIG. 6a or 6b, the offset voltage Vdc_offset on an input line of the comparator may allow the voltage range of the control terminal to be varied. This may be achieved by the comparator generating an amplification control signal. For an IGBT the voltage range might be −10 V to +15 V. For a silicon carbide (SiC) MOSFET the gate voltage range might be −5 V to +20 V. A constant voltage applied at Vdc_offset, in combination with R6 and R7, may set the translation between the logic levels (e.g. 0 V and 3V3) and the control terminal voltage.

Optional coupling switch SW1 may allow the resistor emulation function to be turned off (base of Ω1 open-circuit), operated as a constant current sink (base of Ω1 connected to ground) or enabled. A current drive may be preferable to a voltage source and resistance (resistive drive) under certain conditions described later.

An embodiment of an adaptive drive circuit such as that of FIG. 6a or 6b can be implemented with a small number of components and so may be compact. Furthermore, in embodiments the power dissipation may always be in the transistors that implement the Output Stage current source or sink, and this may lead to a simplified layout and/or easier cooling.

To vary the emulated resistance, it is preferable that R5 can change. This can be implemented with a circuit shown in FIG. 7, for example. In such an embodiment, SW1a is used to select either a logic 0 or 1 through a buffer to drive resistor R1. SW1b is used to enable or disable the output, thus R1 is driven with 0 V, 3V3 or is open circuit. SW2a/b and R2 form the next resistance in sequence, where the value of R2 is twice that of R1. SW3a/b and R3 form the next stage where R3 is 4 times R1.

Figure 7:
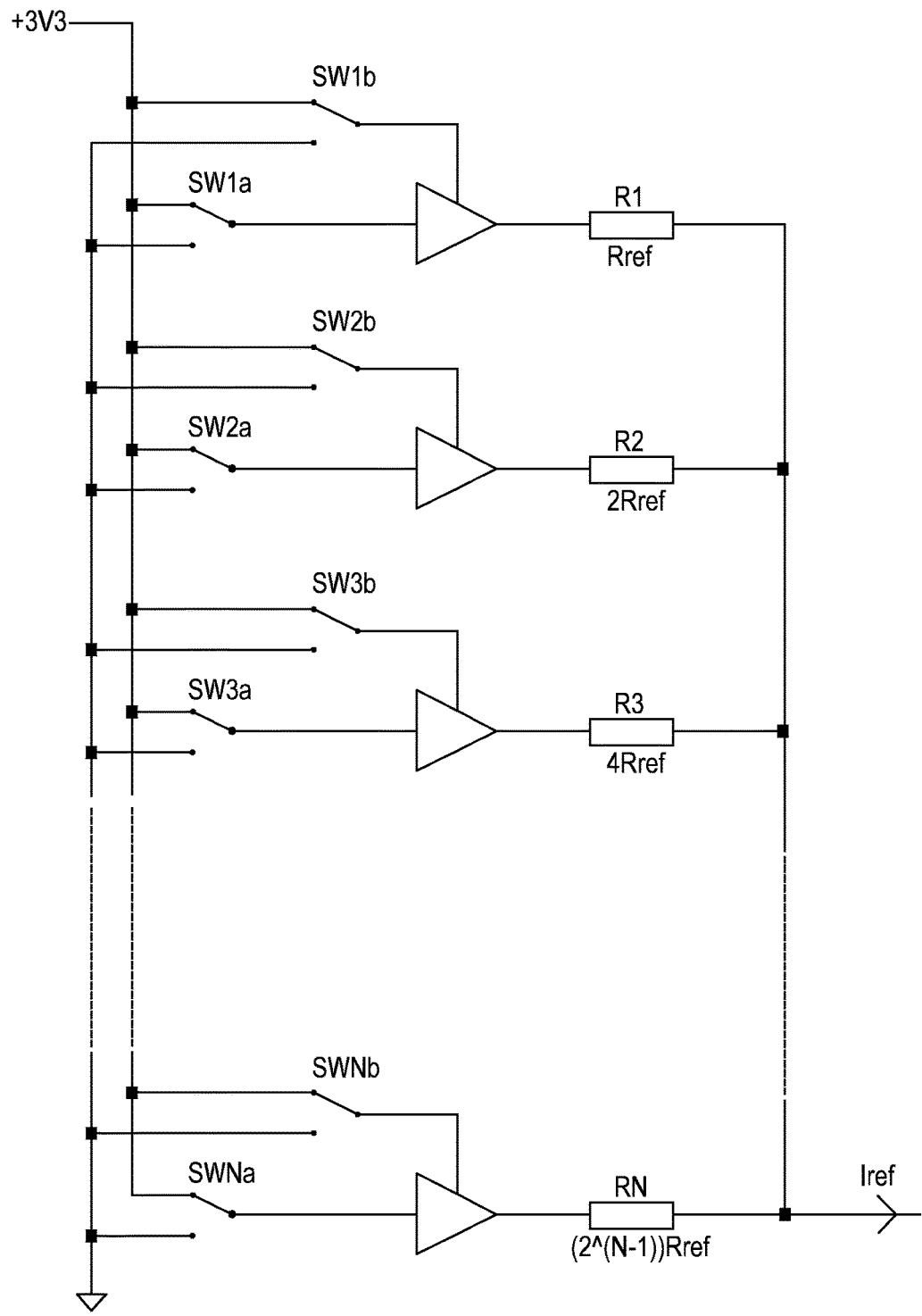
FIG. 7 shows example resistor selection.

This continues for as many stages as required, N in FIG. 7, giving $2^N-1$ possible resistors. The switches and buffers are easily implemented in digital logic circuits (such as a PLD or FPGA) and the resistors can be small signal types as they are not required to dissipate the power switch control terminal current, only a small fraction of it. An advantage of this is that, in embodiments, multiple resistance values can be emulated with very little board area.

It is noted that to satisfy a range of different IGBT modules and power loop topologies (stray inductance), it is desirable that the emulated resistance is configurable. An adaptive drive embodiment, based for example on FIG. 6a or 6b, may enable the resistance to be set with an n-bit digital-to-analog converter (DAC). For example an 8-bit DAC allows 256 (2 to the power 8) resistance values to be configured. Such a scheme could be implemented with multiple parallel resistors, but this may have a number of drawbacks including: adding extra bits takes more board area as the pulse resistors can dissipate significant power; and/or power dissipation is not uniformly distributed across the resistors. It is further noted that such embodiments of the adaptive drive may require one extra pin (on a programmable device) and/or two tiny resistors for each extra bit, so the board area is negligible and the power dissipation is concentrated in the output transistors regardless of the emulated resistance.

In an embodiment, power dissipation may be constrained to the output stage making it easier to manage for a wide range of emulated resistors. Thus, improved thermal performance may be achieved.

Control Regarding Dv/Dt

Figure 11:
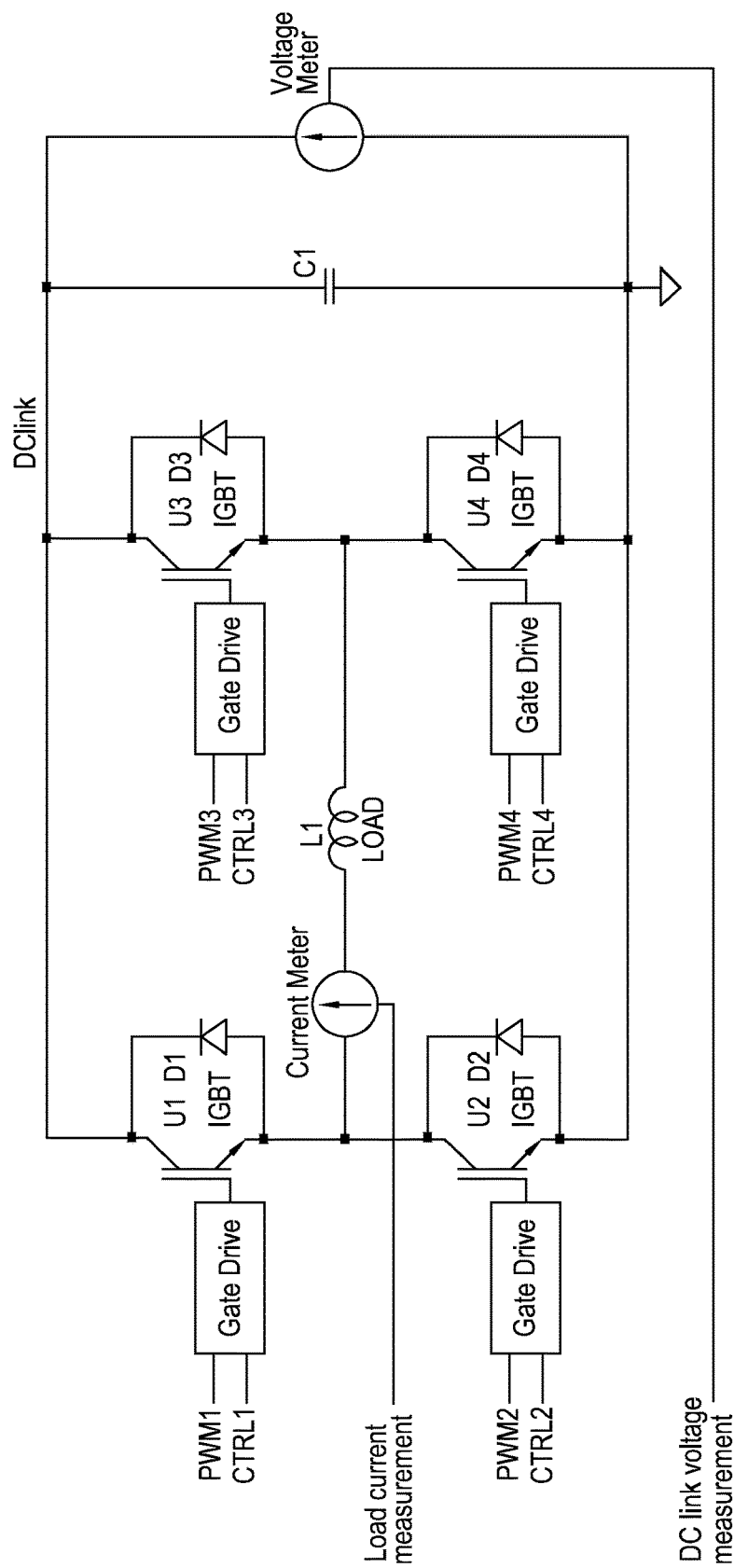
FIG. 11 shows a power converter.

A typical power converter, an example of which is shown in FIG. 11, may comprise multiple power switches, e.g. IGBTs (U1 to U4), a load (L1), and a capacitor bank (C1) which maintains a voltage across the converter (DClink). FIG. 11 may be considered as showing two half bridge circuits (U 1/D1+U2/D2, and U3/D3+U4/D4) providing a full bridge circuit to drive the load L1. Thus, U1 and U2 (similarly U3, U4) provide a series connection of first and second power switches of a half bridge circuit. In FIG. 11 each power switch is coupled in antiparallel with an optional free-wheeling diode (D1 to D4).

To control power flow the current in the load (for example a motor) may be measured and fed back to a control unit. The DC link voltage may also be monitored and preferably regulated to ensure it does not rise above the maximum blocking voltage of the power switches.

In situations where the load is a wound component, such as a motor, it is sometimes desired to limit the maximum rate of change of voltage (dv/dt) seen across the load. This is because the insulation of the wound component can be damaged due to current flowing through the insulation capacitance between windings. Excessive dv/dt can also lead to voltage spikes at the motor due to transmission line effects along the cable between the converter and the motor. As the IGBTs switch they may impose a sudden change in voltage (dv/dt) at the midpoint between U1 and U2, and U3 and U4. This dv/dt can in embodiments be controlled by the gate drive attached to each IGBT.

If the gate drive is a voltage source and resistance (resistive drive) then the dv/dt seen by the load is proportional or inversely proportional to the resistance at turn-ON and turn-OFF. At high load currents, the dv/dt is low and at low load currents the dv/dt is high (e.g. 4 times greater). If it is desired to limit the dv/dt at low load, then it may be preferable to select a larger gate resistor than would be the case at high load. A side effect of this may be to increase power dissipation which is undesirable in a power converter.

The adaptive drive described above, e.g., as shown in FIG. 6a or 6b, may provide a cost effective solution to this problem. Because the emulated resistance can in embodiments be changed, e.g., under software control, the resistance can in embodiments be changed depending on the load conditions. A feedback control scheme may measure the load current and send a signal to the gate drives (e.g. CTRL1 to CTRL4 in FIG. 11) to set a resistance proportionally.

Additionally or alternatively the current in the IGBT may be measured locally by the gate drive and an appropriate resistance set without the intervention of the system controller. Various means of measuring current at the gate drive may be employed, such as integration of di/dt which is found by measuring the voltage developed by the stray emitter inductance (Le in FIG. 9). Other methods include Hall-effect sensors, magneto-resistive sensors, or power switches with a current sense emitter (IGBT) or current sense source (MOSFET, JFET or HEMT). An additional or alternative way to control dv/dt is to drive the IGBT with a constant current. In this case dv/dt is proportional to the source or sink current and does not depend on the load. The resistor emulation circuit can be turned into a constant current source by turning off the emulation function, SW1 in FIG. 6a or 6b.

In some circumstances it is desirable to change between resistor emulation and a current source.

Figure 12:
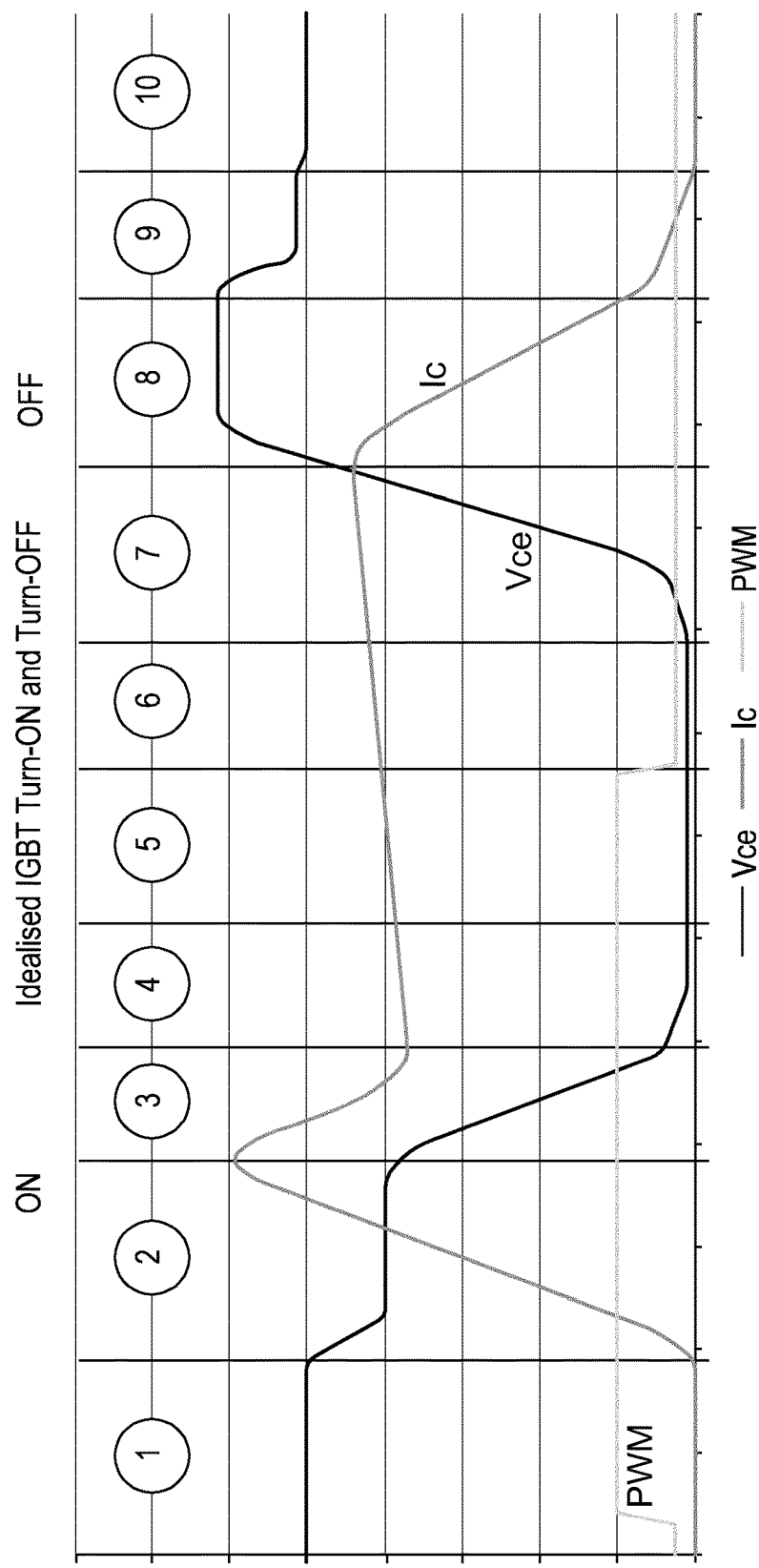
FIG. 12 shows phases of an example IGBT switching waveform.

Considering the example waveforms as shown in FIG. 12, during each phase (1 to 10) of an IGBT switching waveform different drive mechanisms may be employed to optimise behaviour. In this regard, the waveform of FIG. 12 shows one switching cycle of the IGBT has an ON interval having: (i) a fully on period comprising at least phases 4 to 6 of 3 to 6; (ii) a fully off period comprising phases 1 and 10; a turn-on period comprising phases 2 and/or 3; a turn-off period comprising phases 7 to 9. Phase 3 may be considered to be part of the turn-on period, or an ON phase that is a subsequent period, i.e., immediately following, relative to turn-on phase 2. Thus, FIG. 12 shows that a switching cycle may comprise an ON interval and an OFF interval of the IGBT. In some circumstances a voltage source with resistance to set the drive current is optimal, at other times a current source is preferable, and at others it is better for the gate to be held at a specific voltage. An adaptive drive such as that of FIG. 6a or 6b may fulfil these three tasks in one optimal circuit design. The drive profile can be fixed or changed during operation, either within a single cycle, from cycle to cycle due to change in load conditions, or over the long term due to parameter variance (e.g. degradation due to ageing).

With reference to FIG. 12, and considering specifically how to change between resistor emulation and a current source, consider for example turn on during the turn-on period comprising phase 2 and/or 3. The peak in collector current (Ic shown in middle grey) between phases 2 and 3 is due to diode reverse recovery. To protect the diode from excessive power dissipation it is preferable to ensure the diode stays within its safe operating area (SOA) during this phase where both voltage across the diode and current through it may be high. The diode characteristics may be tuned with a resistive IGBT gate drive as the reference drive circuit. During phase 2 therefore a resistive emulation may be preferable. In the case where dv/dt is desired to be controlled, it may be considered to either change the resistance based on the load, or employ a constant current source. Therefore in phase 3 (which may be considered to be a period subsequent to a turn-on period comprising phase 2), where the voltage is changing rapidly it may be desirable to switch to a different resistor setting or to constant current source.

Similarly during turn OFF, phases 7 to 9, there may be a need to change gate current or resistance in order to limit the dv/dt, the maximum voltage across the IGBT (Vce shown in black), or the rate of change of collector current (dIc/dt).

An adaptive drive circuit for example based on FIG. 6a or 6b may enable these configuration changes without the need to use two or more different circuits.

One method to measure the load current without the need for additional circuits is to measure the time in certain phases. During turn-ON, the time spent in phase 2, or 2 and 3, may give an indication of the magnitude of the load current. During turn-OFF the time spent in phase 8 may similarly indicate the magnitude of the load current. This is particularly true if the di/dt is constant or changing little with load. Certainly resolution is sufficient to select a small number of different resistors. For example a system clock of 100 MHz can measure, using a counter, the time the IGBT spends in each phase to an accuracy of 10 ns. An example time in phase 2 or 8 might be 0 to 500 ns, which corresponds to a count value of 0 to 50. In this case it may be appropriate to select one of 5 different resistors for counts of 0 to 10, 11 to 20, 21 to 30, 31 to 40, and 41+ for example.

Further regarding the above, it is noted that:
the start of phase 2 may be indicated by detecting with a di/dt sensor a positive measurement (generally small) of di/dt (the current i being for example a collector current). Such a measurement may indicate voltage dropped across emitter stray inductance in an embodiment;
the start of phase 3 may be indicated by detecting a reversal in direction of rate of change of current, e.g., collector current. Such a reversal may occur when the di/dt goes negative;
the start of phase 4 may be detected when the voltage across the power switch, e.g., Vce of an IGBT) goes below a threshold, e.g., 10 V; and/or
the start of phase 8 may be detected when di/dt goes negative. The end of phase 8 may be indicated by detecting when di/dt goes below a negative threshold, this indicating in an embodiment that current is not changing.

Clamping

In a power converter, at turn-off there is generally a relationship between the DC bus voltage (Vdc), the rate of change of current (di/dt), the commutation loop inductance (L) and the peak voltage (Vpeak) experienced by the power semiconductor. This is described in the equation, Vpeak=Vdc+L di/dt. The peak voltage is preferably kept below the IGBT maximum rating. For a given layout topology the inductance is fixed. There may be a trade-off between maximum allowable DC bus voltage and maximum switching speed (di/dt).

This may be achieved by either measuring and limiting di/dt to a predetermined value, or by measuring the voltage across the IGBT and limiting its switching speed to keep the voltage within its rating. The latter is known as active clamping and is often performed by a string of transient voltage supressors (TVS or transorbs) connected between the collector and gate. A TVS is a type of passive component that conducts when the voltage across it exceeds a specific value. If the voltage across the IGBT exceeds a predetermined clamp voltage, the TVS chain conducts injecting current into the gate. This has the effect of opposing the turn-off current flowing out of the gate, slowing down the switching process and limiting the di/dt.

A TVS clamp circuit may have any of the following limitations:
Power dissipation of the TVS chain is limited which means the clamp circuit can only be used periodically and is not normally suitable for continuous operation.
The relationship between current and breakdown voltage (the point at which the TVS begins to conduct) has a wide tolerance. The breakdown voltage also varies with temperature which means it is difficult to precisely guarantee the clamp voltage and derating is required, leading to a lower maximum DC bus voltage than would otherwise be required.
It is necessary to detect the current flowing in the TVS chain and turn off the drive circuit to prevent the two circuits opposing each other leading to excessive power dissipation (this is known as advanced active clamping).
The clamp voltage required to protect the IGBT during turn-off may be too low to allow normal operation of the converter. It is not possible to disconnect the TVS chain, so a workaround is to employ a 2-level clamp so that the clamp voltage can be raised when the IGBT is off.
Creepage and clearance (spacing between components) of the high-voltage TVS chain means the board area required is significant. The area is even greater with the added complexity of advanced active clamping and 2-level turn-off.

For these reasons an improved clamping scheme is desired to address any disadvantage^) such as one or more of the above.

In an embodiment, a clamp voltage can be precisely set with an n-bit DAC. During turn-off (and only during turn-off), if the voltage across the IGBT goes beyond, e.g., exceeds the clamp voltage, the drive circuit which is sinking current, may be turned off and current injected into the gate, slowing down the turn-off and limiting rate of change of collector current (di/dt). In an embodiment where a common drive stage is used and the drive circuit cannot simultaneously source and sink current, there may generally be no possibility of excessive power dissipation. The voltage may be measured by a potential divider, which may have similar creepage and clearance requirements to a TVS chain, but as there may generally be no appreciable power dissipation in the potential divider, the components can be reduced in size (compared to the TVS chain) and/or also encapsulated in a "potting" compound to reduce size further.

In embodiments, the clamp voltage can be set over a wide range making a single design applicable to a range of IGBTs and operating conditions. Furthermore, the voltage measurement circuit can be shared with other functions, such as overcurrent protection (measurement of the on-state voltage drop across the IGBT). One enhancement found to be advantageous is to add in a component of dv/dt which gives advance warning of the IGBT reaching the clamp voltage.

Figure 13:
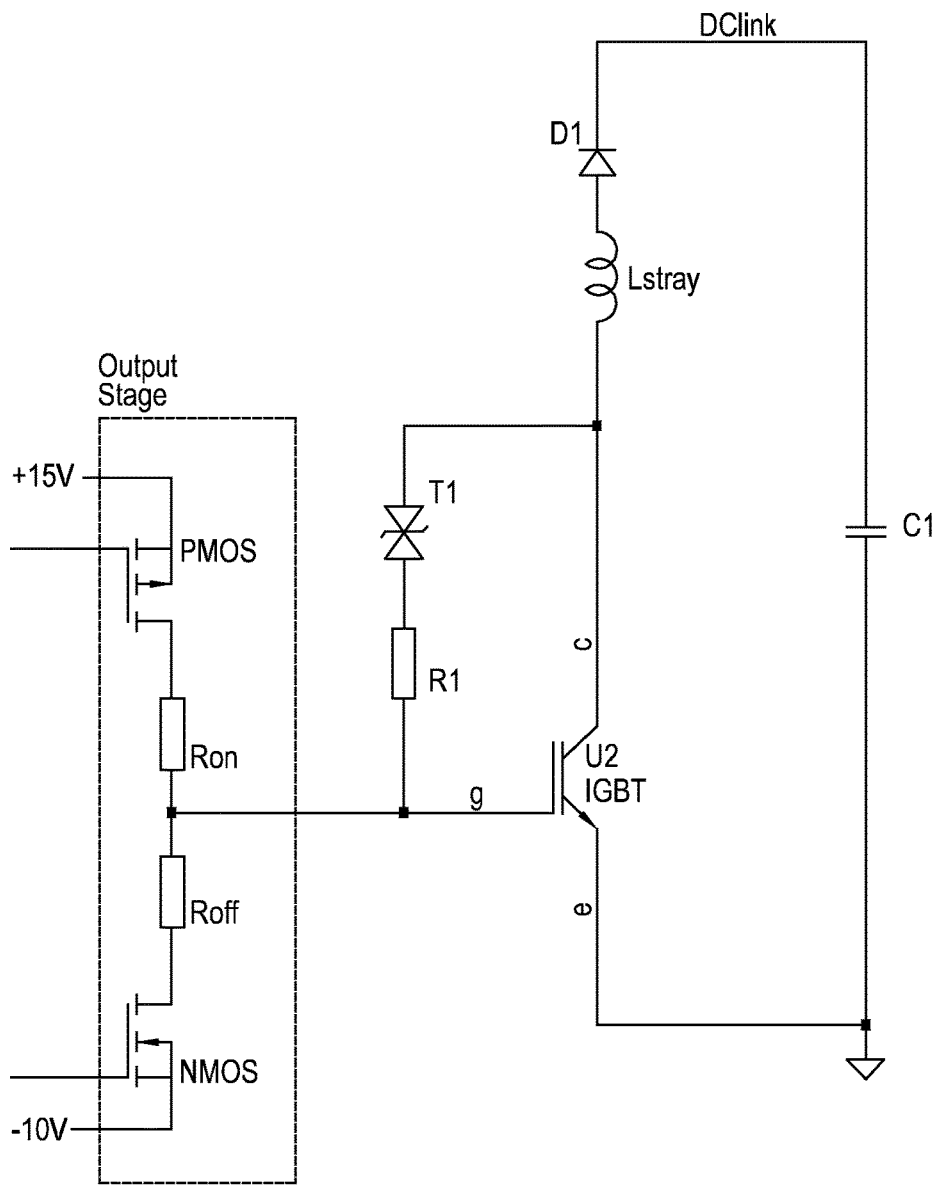
FIG. 13 shows an example resistive drive with transorb clamping.

Considering clamping using transorbs, FIG. 13 shows part of the H-bridge circuit from FIG. 11. IGBT U2 is shown with its commutation diode D1 and some stray inductance (Lstray) which is always present in a practical implementation. The output stage of the gate drive is shown with a voltage clamping circuit comprising T1 and R1.

During turn-OFF of U2, a voltage develops across Lstray due to the change in current di/dt. The voltage is proportional to Lstray and di/dt. This voltage adds to the voltage across C1. If the sum of these voltages exceeds the maximum voltage rating of the IGBT (U2) then it may be destroyed. The clamping circuit is employed to limit the voltage across the IGBT. T1 is a transient voltage suppressor (TVS) also known as a transorb. T1 has a breakdown voltage, and when exceeded current will flow from the IGBT collector (c) to the gate (g). The effect is to inject current into the gate and effectively slow down the turn-OFF. This limits di/dt and therefore the maximum voltage developed across Lstray.

In another scheme, the NMOS transistor is turned off when current is detected in R1 to avoid excessive power dissipation and increase the effectiveness of the clamping action.

Transorb T1 may be replaced with two or more devices to reach a specific breakdown voltage to match the IGBT. For example in a gate drive for a 1200 V IGBT, a string of six 130 V transorbs may be used to give a breakdown voltage of 780 V. If the voltage across the IGBT exceeds 780 V then current will flow in the transorbs and limit or clamp the voltage. However, transorbs exhibit wide tolerance range and temperature dependence. This is why it is preferable to set the breakdown voltage at 780 V for a 1200 V device. If the DC link is above 780 V the transorbs may be continuously conducting. This is undesirable as power dissipation limits lifetime. In practice therefore such an approach generally only works well for infrequent or abnormal conditions, unless the transorbs are significantly overrated. The maximum DC link voltage may also be limited well below the IGBT limit.

Figure 14:
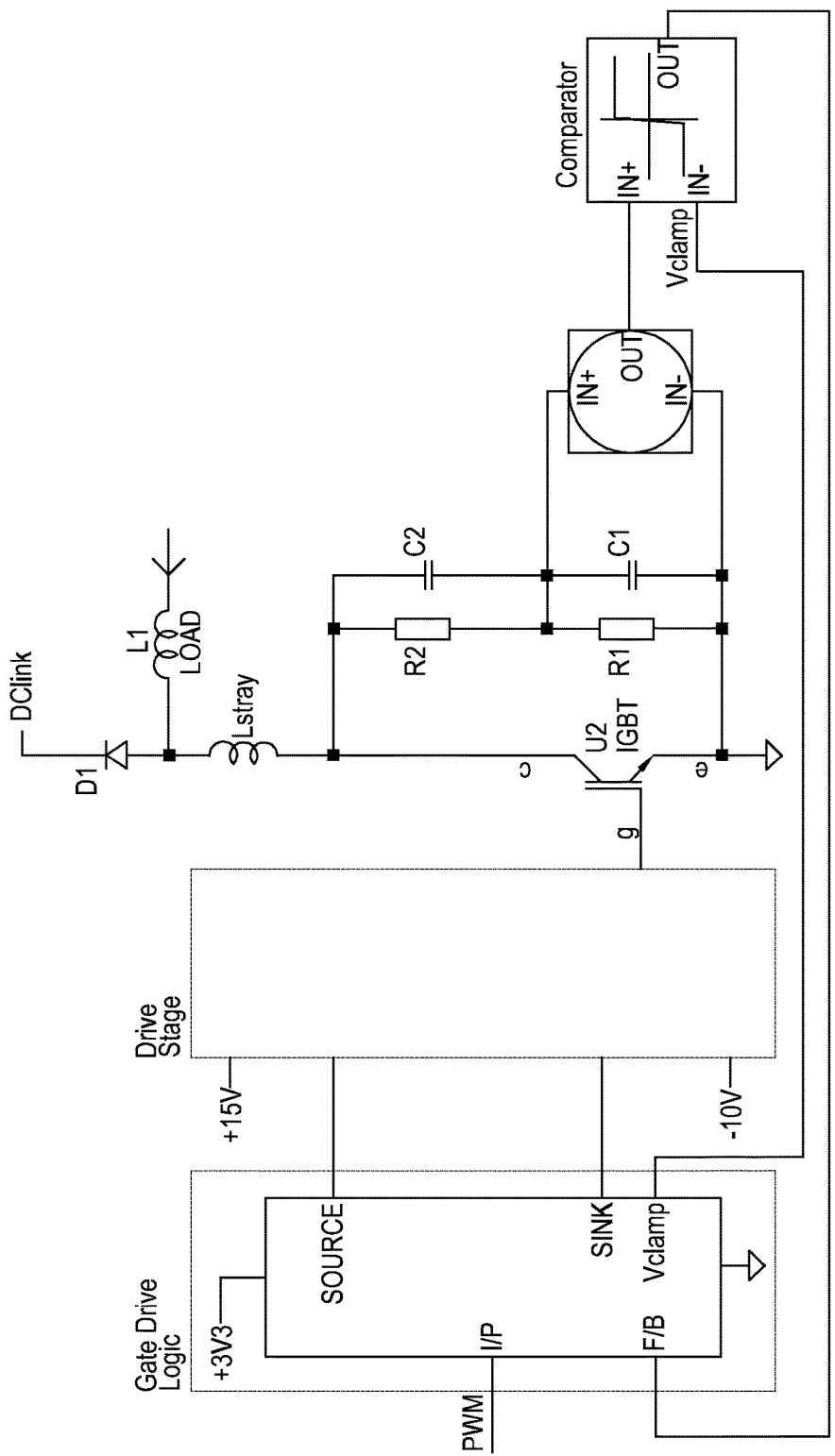
FIG. 14 shows an arrangement that performs measurement of clamp voltage using a potential divider.

Embodiments however use a potential divider to measure the voltage across the power switch, e.g., IGBT (U2). An example is shown in FIG. 14, showing merely for example a first power switch U2 of a lower arm of a half bridge circuit (an optional commutation diode of this arm not shown) and a commutation diode D1 of an upper arm of the half bridge circuit (a second power switch, i.e., that of an upper arm, not shown). The generally inductive load L1 is coupled to an output line connected between the lower and upper arms. The combination of R1/C1 and R2/C2 series capacitive impedances form a potential divider. (Example component values being R1=3 kΩ, R2=1, 5 MΩ, C2=20 pF and/or C1=10 nF). The voltage across R1 is measured and compared by the clamp comparator to a reference voltage (Vclamp). Thus, in this example the R1 voltage is used as an indicator of a power switch variable in the form of the emitter-collector voltage of the power switch U2. If the voltage across R1 exceeds a clamp value Vclamp, the output of the comparator is a logic high (1) and if less than Vclamp the output is a logic low (0). Preferably the series impedances have a ratio such as 500:1 for, e.g., R1 C1:R 2C2, over the required bandwidth from DC to a high frequency beyond which the ratio may roll increase of decrease or may roll off/up.

Figure 15:
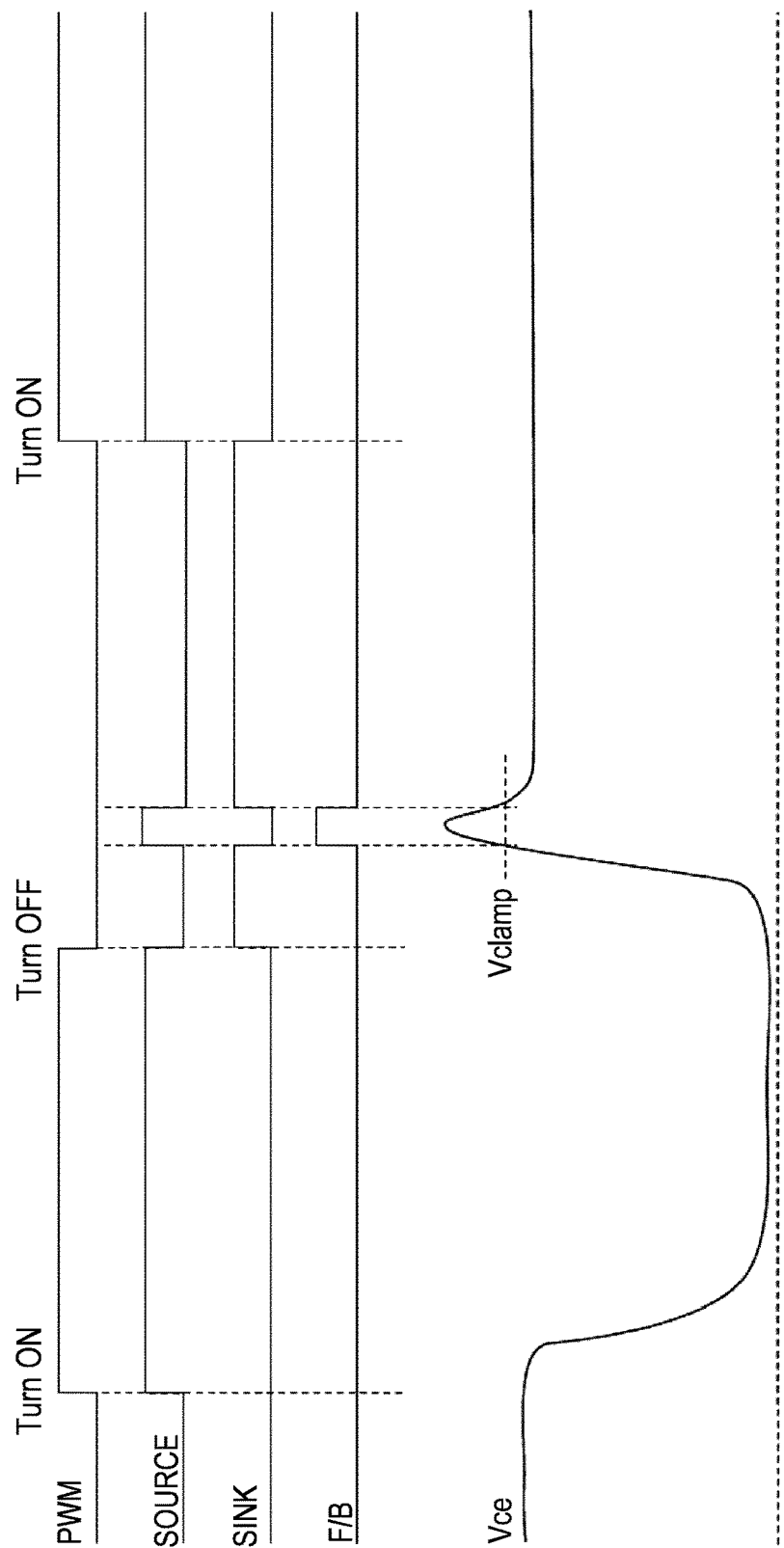
FIG. 15 shows example timing diagram of comparator feedback with source and sink signals.

The comparator output is fed back to the gate drive control logic which in turn reverses the current flow. The sequence of events is shown in FIG. 15.

The drive stage shown here could be a standard resistive drive, or an adaptive drive described earlier, e.g., as shown in FIG. 6a or 6b. The signals SOURCE and SINK denote whether the drive circuit is sourcing or sinking current, preferably regardless of the implementation.

For more effective operation it is preferable to minimise the propagation delay of the feedback, e.g., from voltage sense, through the Comparator, Gate Drive Logic, Drive Stage and Output Stage. In practice it is difficult in some embodiments to achieve high bandwidth of this feedback control circuit, even if the digital logic is removed and the full circuit is implemented in analog electronics. With insufficient bandwidth in the loop, the result may be overshoot beyond the clamp voltage (Vclamp) as shown in FIG. 15.

Figure 16:
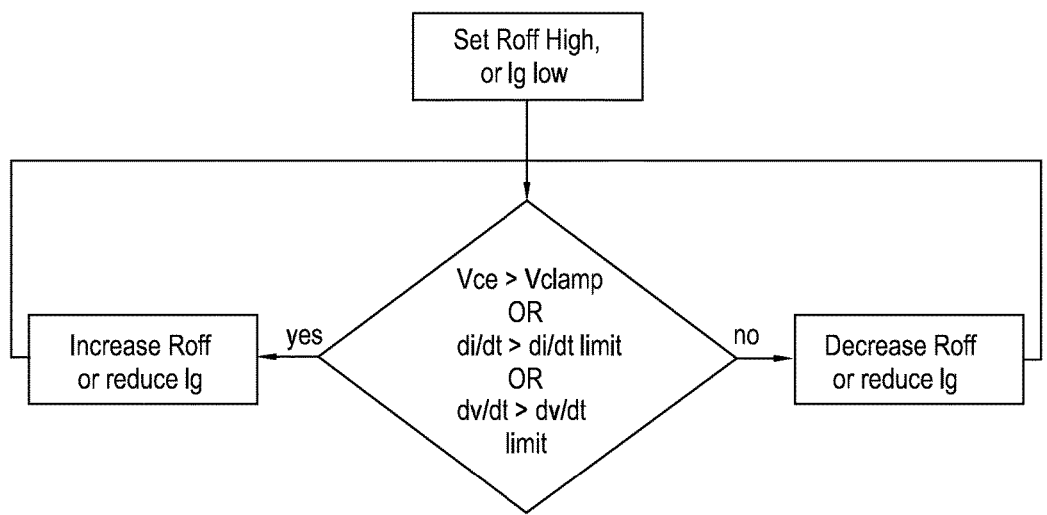
FIG. 16 shows an example cycle-by-cycle control scheme for Roff or Ig selection.

However, a cycle-by-cycle control scheme may be used to select an appropriate turn-OFF resistor or reduce an output current, e.g., the current provided by the current output circuit of FIG. 6a or 6b (such output current being determined for example by a controllable resistor R5). In embodiments such a scheme may reduce or prevent such overshoot. An example of such a scheme is shown in FIG. 16. For embodiments, FIG. 16 may be understood as referring to a resistor Roff (see FIG. 1 or 13) that is in embodiments controllable (e.g., digital resistor and/or resistor network), the voltage across the power switch (collector-emitter voltage Vce for an IGBT), control terminal (e.g., gate) current of the power switch (Ig), rate of change of current through the power switch (e.g., collector current di/dt of an IGBT), rate of change of the voltage across the power switch, and/or a clamp value Vclamp.

By default a high value resistor Roff may be chosen. If the voltage on/across the power switch (Vc, Vce) at turn-OFF does not exceed the set clamp voltage, the resistor setting may be reduced on the next cycle. This may continue until the clamp is reached. If the clamp voltage is exceeded then the resistor setting may be increased. The comparison to the clamp voltage may be performed by a limit comparator, e.g., the above-mentioned clamp comparator of FIG. 14.

More generally, the comparison may be of rate of change of current through the power switch (dIc/dt for an IGBT) relative to a di/dt limit value, or of rate of change of the voltage on/across the power switch (e.g., dVc/dt) relative to a dv/dt limit value.

A similar scheme using a constant gate current (Ig) could be implemented. Such a scheme may reverse a current between the switch drive and control terminal. This may comprise switching or changing a fixed and/or constant current or emulated resistor. With a resistive drive, the rate of change of voltage (dv/dt) across the power switch may give some advanced indication of the di/dt (rate of change of, e.g., collector current) that will occur. Measurement of dv/dt, implemented for example with a capacitor to the IGBT collector terminal (c), may be used in the feedback control loop described in FIG. 16. Similarly di/dt could be used as an input to this process.

Figure 1:
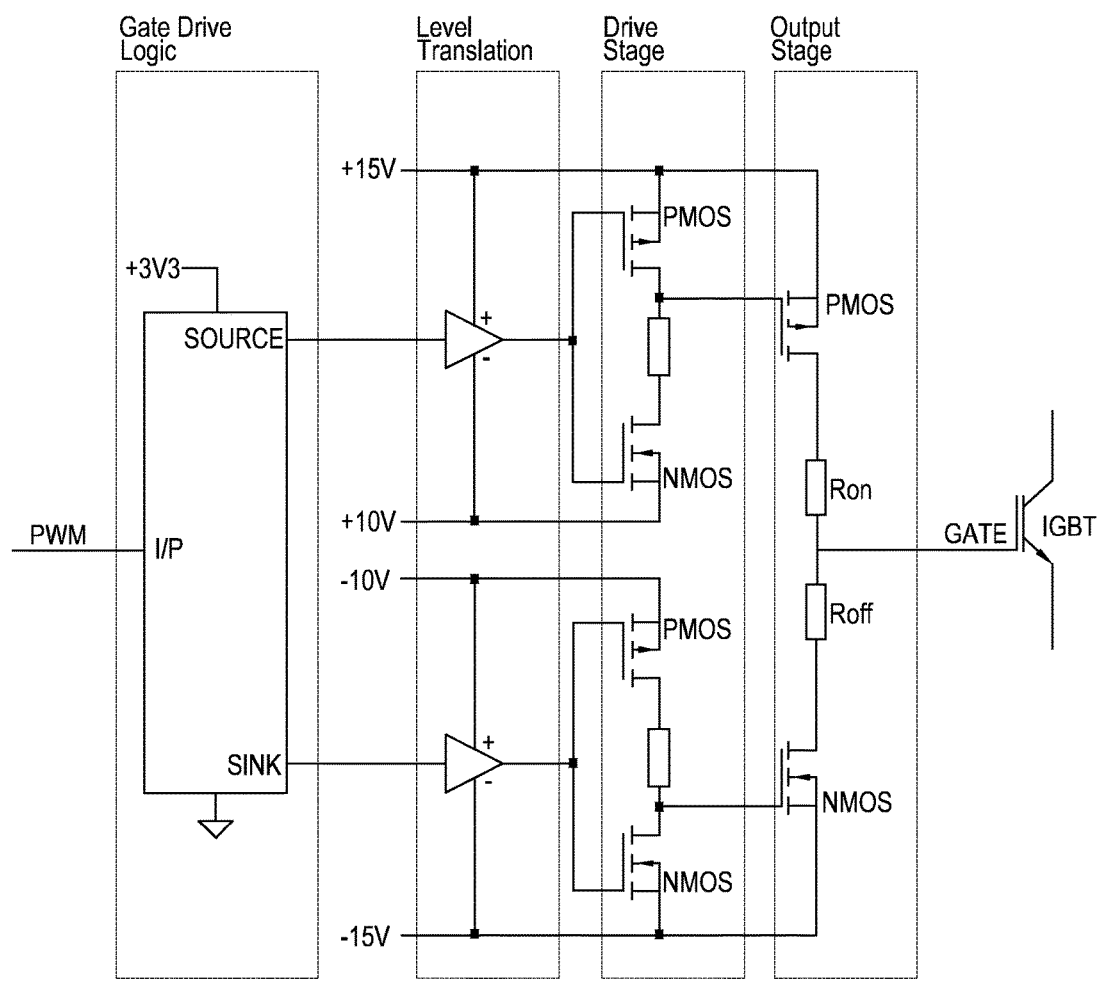
FIG. 1 shows a drive stage of an IGBT gate drive.

Additionally or alternatively, resistance may be changed based on the DC link voltage, for example by making use of a standard drive as in FIG. 1 albeit with controllable output resistance(s), or an adaptive drive such as that shown in FIG. 6a or 6b. If the turn-OFF resistance is increased, or turn-off current reduced, the turn-OFF di/dt will be reduced, and in turn the voltage overshoot due to the stray inductance will be reduced. The turn-OFF resistance may be Roff of FIG. 1 when implemented as a controllable resistor having controllable output resistance, Roff here in series with an NMOS control switch (in another embodiment the control switch may be p-type). In an embodiment having adaptive drive, e.g., as in FIG. 6, the controllable output resistance may be an emulated resistance, e.g., emulation of R5 in FIG. 6a or 6b.

A high value resistor is undesirable at low DC link voltages, where clamping may not be necessary as the power dissipation (turn-OFF switching loss) in the IGBT be increased. At high DC link voltages, the power dissipation may be dominated by the energy stored in the stray inductance, so using a high value resistor (switching slowly) may result in the same power dissipation as switching fast and clamping.

A feedback control scheme based on monitoring the DC link is proposed. This could be implemented in a central controller or the gate drive.

Figure 17:
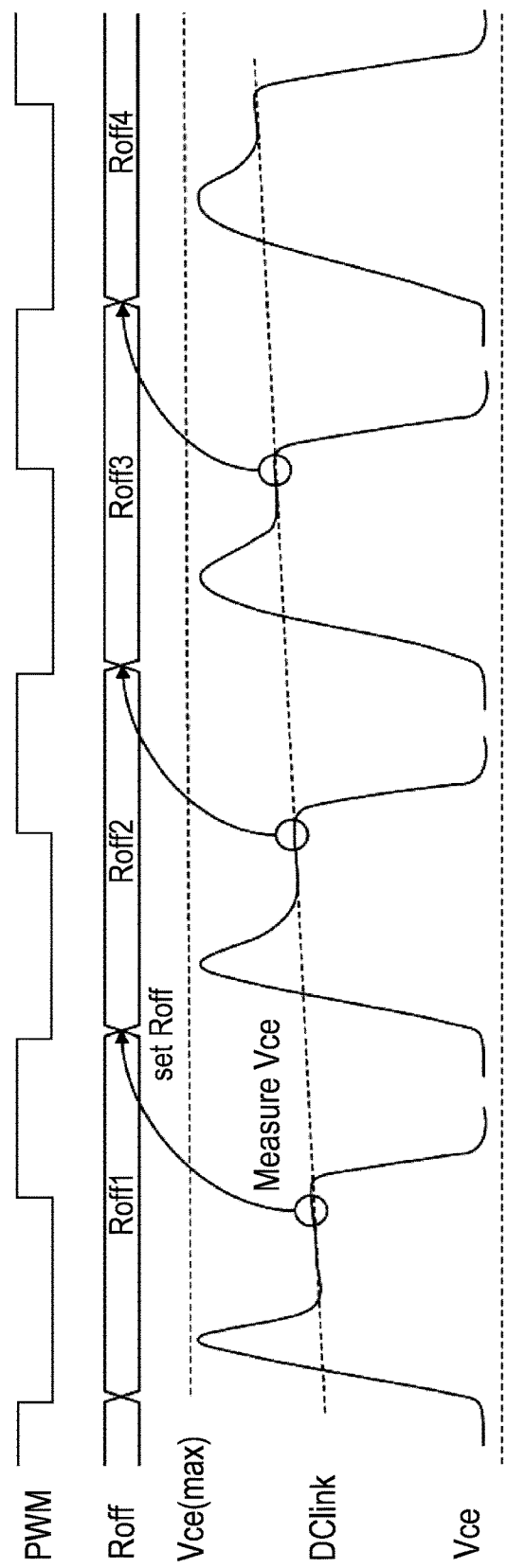
FIG. 17 shows an arrangement for measurement of DClink, preferably based on Vce, and changing Roff for a next cycle.

FIG. 17 shows an example a timing diagram with DC link rising over time. The DC link is measured, preferably based on collector voltage for example by means of a potential divider (see FIG. 18), and Roff changed to limit the switching speed at the next turn-OFF event. In practice the change in DClink would be slow so it may not be necessary to change resistor setting on every switching cycle, but it is possible.

For a given converter Lstray can be measured, and a look-up table created to select an appropriate resistor for a measured DC link voltage.

Figure 18:
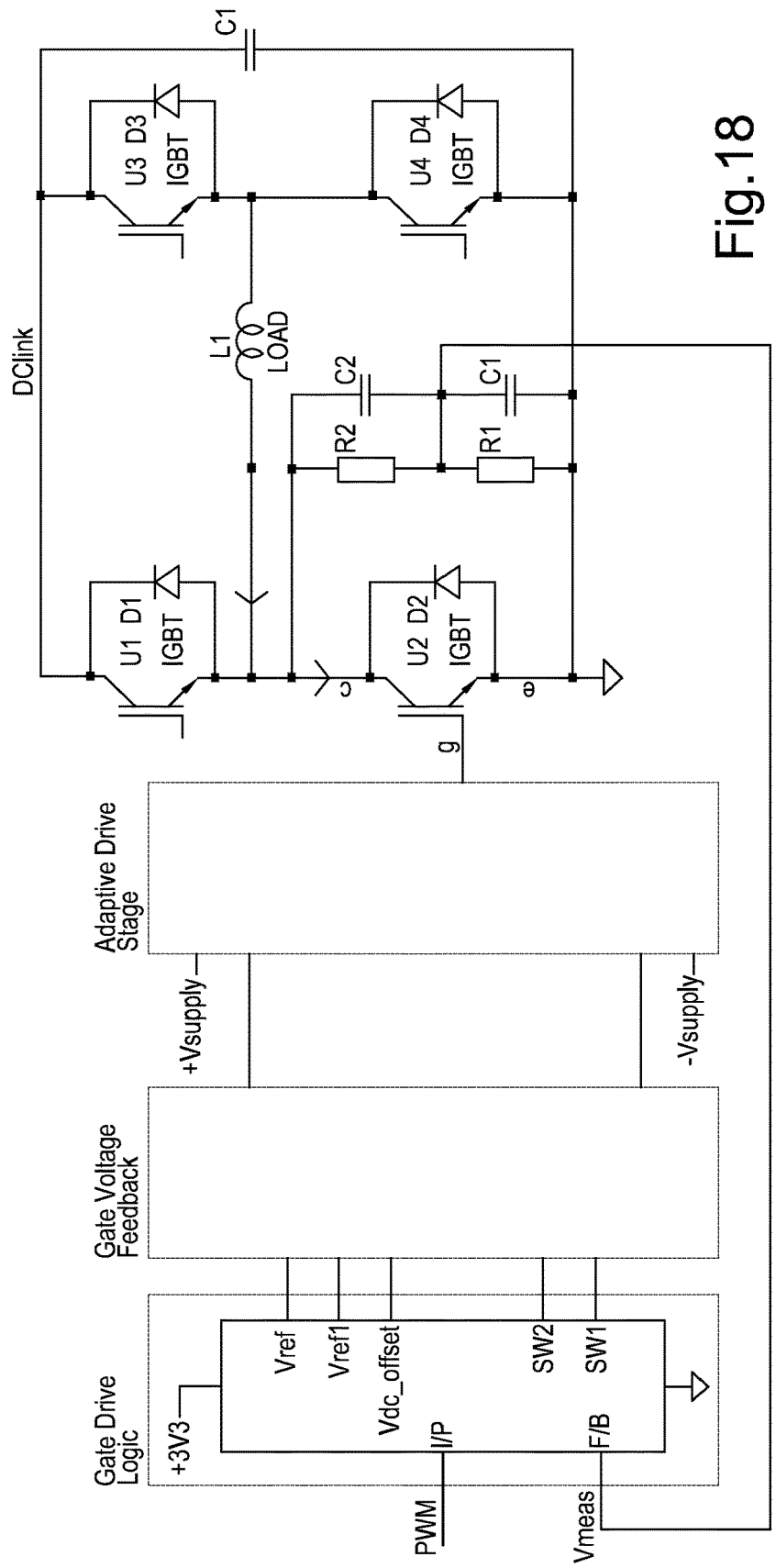
FIG. 18 shows an example of measuring DClink, preferably based on Vce, and feedback circuit.

FIG. 18 shows a feedback control diagram implementing the scheme using an adaptive drive such as that of FIG. 6a or 6b. A DC link is shown as comprising capacitor C1 coupled across both the U1/U2 and U3/U4 phase legs. A DC link voltage on the line labelled "DClink" in FIG. 18 may be monitored, preferably by means of Vce.

A further refinement is to measure the load current as well as the DC link voltage and create a more complex look-up table. This is particularly useful for situations where the DC link voltage varies with load. For example in a solar converter, the DC link can be high under low load conditions (e.g. when the converter is disconnected from the grid), however under normal operating conditions the DC link operates at a lower voltage. Two separate resistors could be selected for the two cases.

Gate Boost

To reduce conduction losses it is desirable for a power switch control terminal, e.g., the IGBT gate, to be held at the highest possible voltage when the device is on. In this regard, it is desirable that a gate drive can detect a high current and turn-off the IGBT safely within the short-circuit withstand capability time.

The time is usually specified at a particular gate voltage. If the IGBT is operated at a higher gate voltage, this time is undefined, therefore it is desirable to detect a high current condition and reduce the gate voltage, e.g., to 15 V, very quickly. To limit the current flowing in the IGBT it may be preferable to reduce the voltage even further (e.g. 10 V) until the current stabilises and then the IGBT can be switched off a safely. An IGBT can be destroyed if it is turned-off quickly whilst the current is still changing.

It is further desirable to make a universal gate drive able to configure the gate voltage(s) at which the power switch control terminal may be held.

In view of the above, operation of a power switch such as an IGBT at higher control terminal voltage may reduce power dissipation. However, in order to protect the power switch, it is desired to reduce the voltage when high current occurs through the switch. "Gate boost" control of gate voltage may be advantageous for driving a power switch such as an IGBT at a high voltage while allowing reduction of the voltage under a short circuit condition. Such advantages may be achievable where the power switch is provided in a power converter to drive an, e.g., inductive, load.

For controlling voltages on the control terminal, e.g., gate, it could be considered to implement two power supply rails (e.g. +15 V and +18 V) and switch between them. However, this may require additional power supply smoothing capacitors and/or a more complex DC-DC converter. Furthermore, capacitance in the converter and/or driver may significantly slow down switching between rails.

In embodiments, a feedback circuit may be employed to allow control terminal voltage adjustment for protecting the power switch. An embodiment may use just one rail, the rail having a voltage above the normal, e.g., manufacturer recommended, operating voltage of the power switch. The control terminal may then be operated at a high voltage, which may however be reduced by a feedback circuit upon detecting an indication of high power switch current, e.g., such current through a collector (Ic), emitter, source or drain terminal of the power switch. The indication may indicate a high said current as such, or a high rate of change (preferably increase in magnitude) of such a current or, in embodiments, a high rate of change of voltage across/on the power switch.

For example, voltage across an inductance in series with the power switch (e.g., stray inductance of the power switch module) may be measured to indicate the rate of change of current di/dt, and this indication fed back to control circuitry (e.g., gate drive logic) to adjust parameter(s) to thereby reduce the power switch control terminal voltage. Additionally or alternatively voltage, or rate of change thereof, across/on the power switch (e.g., Vc, Vce), may be monitored to feed an indication back to the control circuit to adjust the parameter(s). When a value (e.g., magnitude) of, e.g., current, di/dt, voltage and/or dv/dt beyond (e.g., above) a threshold is detected, the power switch may be controlled to reduce the control terminal voltage from, e.g., 18 V to 15 V.

Figure 19A:
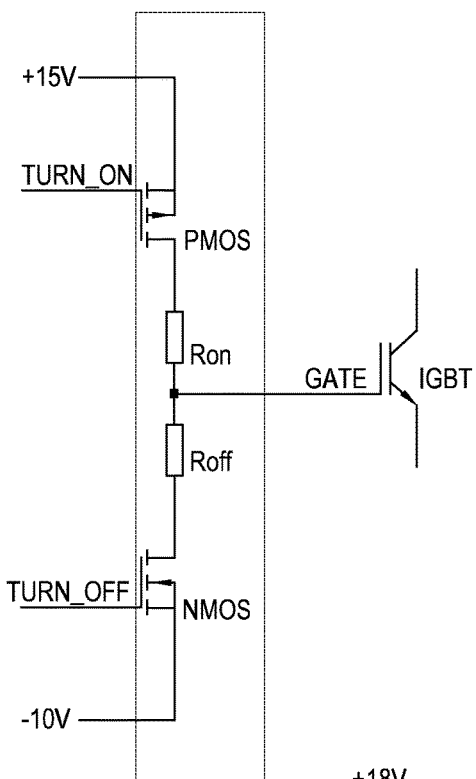
FIG. 19a, b show two alternatives for an output stage; the example of FIG. 19b for a gate boost implementation is implemented with two additional PMOS transistors as shown, and may require an additional voltage rail (e.g., 18 V) with associated capacitors.
Figure 19B:
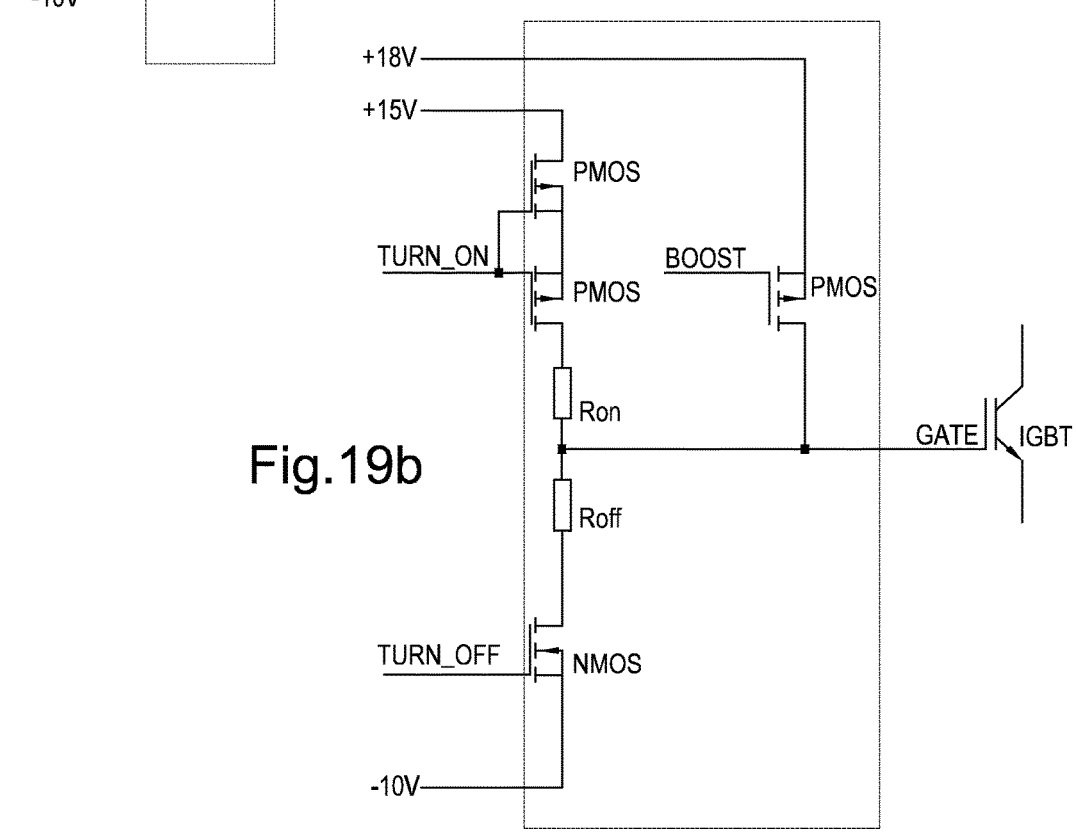
Figure 20:
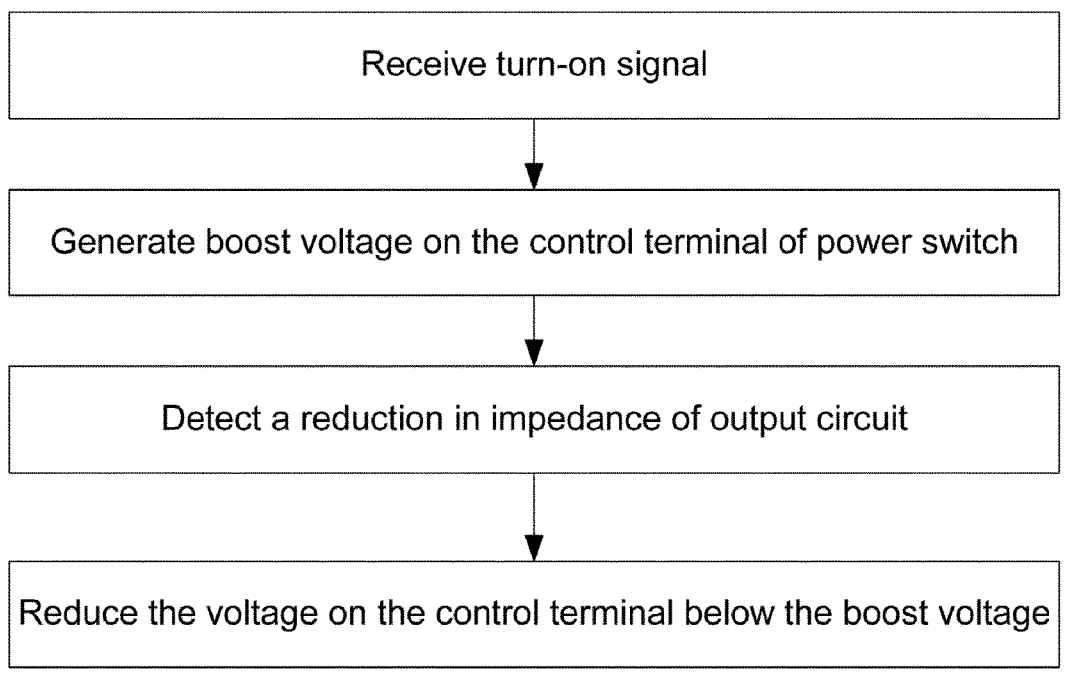
FIG. 20 shows an embodiment of a gate boost method.

Such feedback to preferably reduce control terminal voltage in the event of a (potential) short circuit condition may be applied with or without an adaptive drive such as that of FIG. 6a or 6b. For example, such feedback may be used to control the drive of FIG. 1 to adjust gate voltage (an alternative output stage is shown in FIG. 19b). It is noted that the use of resistor emulation is not required to implement a gate boost embodiment, preferably however, the feedback is provided with an adaptive drive as for example shown in FIGS. 6a, 6b and 8a/b, which may be considered as showing a negative feedback circuit comprising the Isource component of an current output circuit, component R7 of a terminal voltage input circuit, an amplifier comprising Q1, a reference voltage input circuit comprising resistor R5 and coupled to the emitter (in this case, the charge supply input) of the amplifier. The output signal to control the control terminal voltage may be a current signal from a current source (sink) as shown in FIGS. 6a, 6b and 8a/b.

Figure 8A:
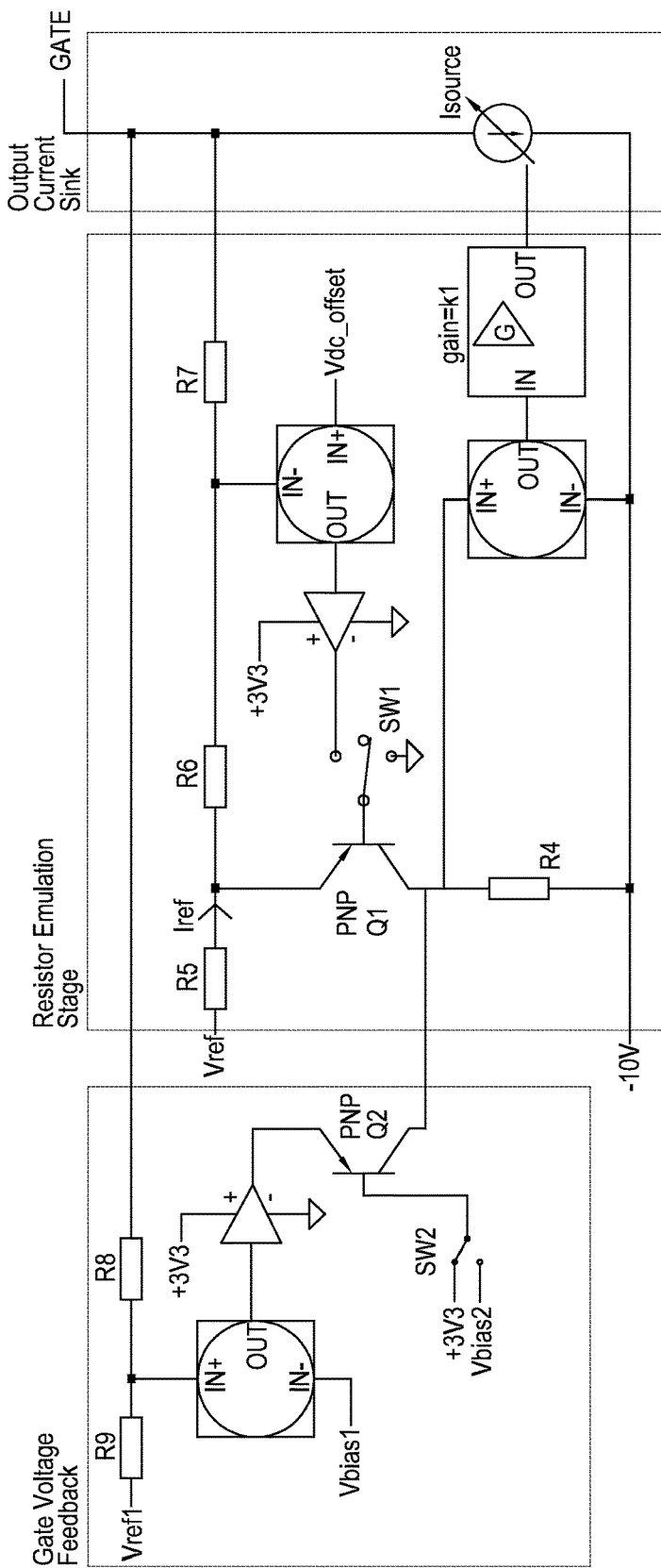
FIG. 8a shows an adaptive drive comprising a gate voltage feedback circuit; this may form a lower voltage side of a power switch drive.
Figure 8B:
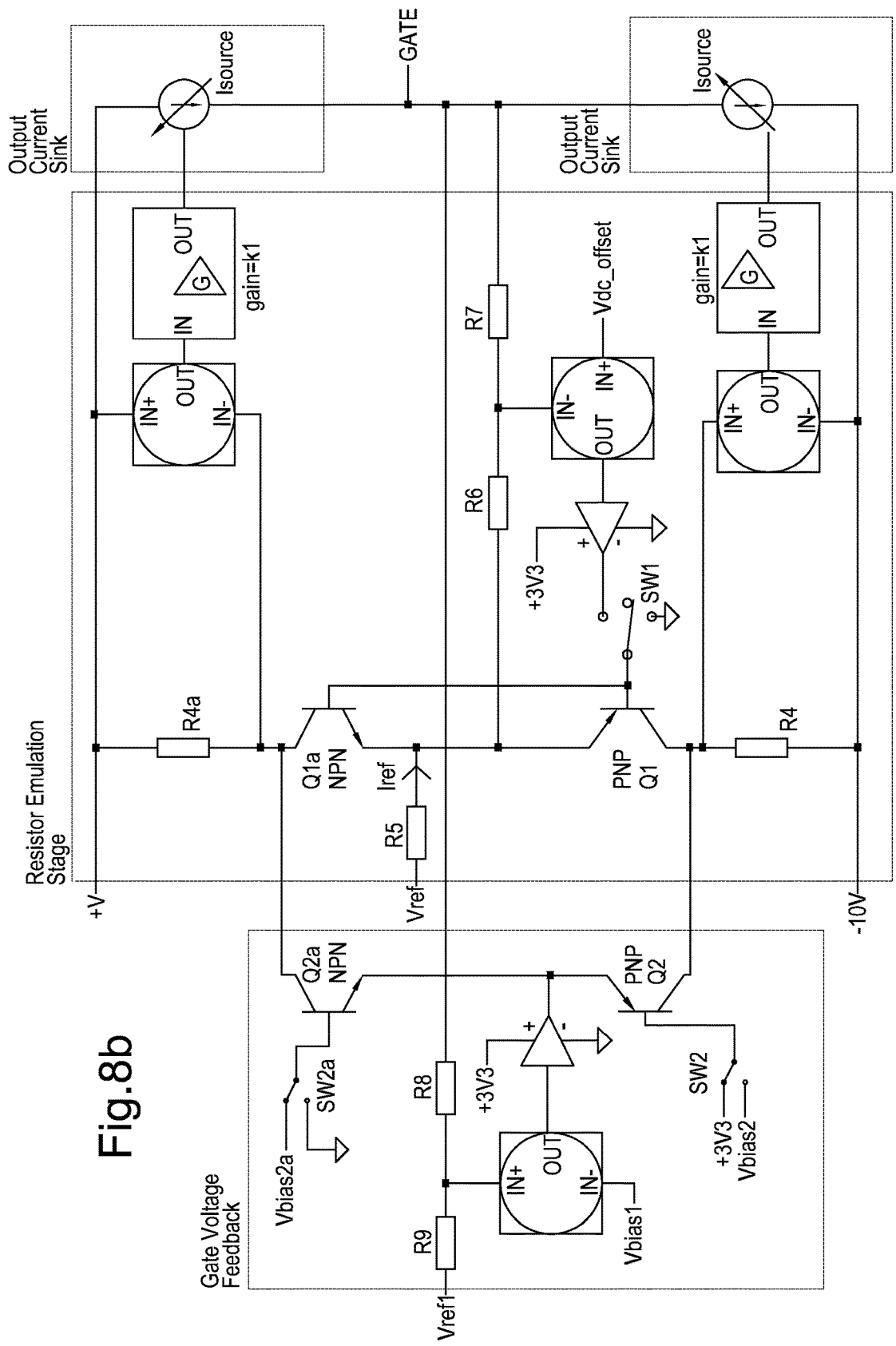
FIG. 8b shows an adaptive drive comprising gate voltage feedback for higher and lower voltage sides.

FIGS. 8a and 8b show that an adaptive drive such as that of FIG. 6a or 6b may be combined with a gate voltage feedback circuit having an input (Vref1). The gate voltage feedback circuit may enable the gate to be held at any of number of different voltage levels, where the number is set for example by a digital-to-analog converter (DAC) input to Vref1, preferably based on an above-mentioned high current indication. Such voltage levels may comprise +15 V (on) and/or −10 V (off) for an IGBT. Such a DAC is an example of a controllable voltage source to provide a control terminal reference voltage, e.g., Vref1.

FIGS. 8a and 8b may further be considered as showing a voltage control circuit comprising, e.g., the current source (sink), R8, Q2 and the amplifier having gain k1, such a circuit preferably being active when the resistor emulation is disabled by coupling switch SW1 (SW1 in an embodiment selectively disabling dependency of amplifier control on output of a terminal voltage input circuit). To enable control terminal voltage control by the gate voltage feedback circuit, the constant current and resistor emulation functions of an adaptive drive may be disabled by a switch, e.g., SW1 of FIG. 6a, 6b. The voltage control circuit may be enabled by coupling switch SW2 (SW2 in an embodiment selectively enabling dependency of amplifier output on Vref1). When resistor emulation is turned off, the control terminal voltage may be controlled by an output signal from the driver output stage preferably comprising a current output circuit, e.g., source or sink (labelled Isource in FIG. 8a). It is further noted that the resistor R8 may provide the indicator of voltage on the control terminal (i.e., the controlled voltage), i.e., IGBT gate, to the gate voltage feedback circuit.

The voltage at node Vref1 may be for example 0 V for IGBT ON (load driven to +Vsupply by the reciprocal source circuitry (not shown in FIG. 8a)) and 3V3 for IGBT OFF (load driven to −Vsupply). With SW2 in the position shown in FIGS. 8a and 8b, the gate voltage feedback circuit is disabled as Q2 is turned off. With SW2 connected to Vbias2, the gate voltage feedback control loop may be enabled. Vbias2 is a voltage in the range of, e.g., 0 V to 3V3, and may be chosen to ensure that the circuit does not dissipate excessive power. The Vref1 control, e.g., by DAC, may enable the voltage range to be adjusted to suit different power switches, e.g. −10 V to +15 V for an IGBT, −5 V to +20 V for a silicon carbide MOSFET. Vbias1 may be a voltage in the range 0 V to 3V3, e.g., 1V65 in a 3V3 system, but its value is less important.

Figure 9:
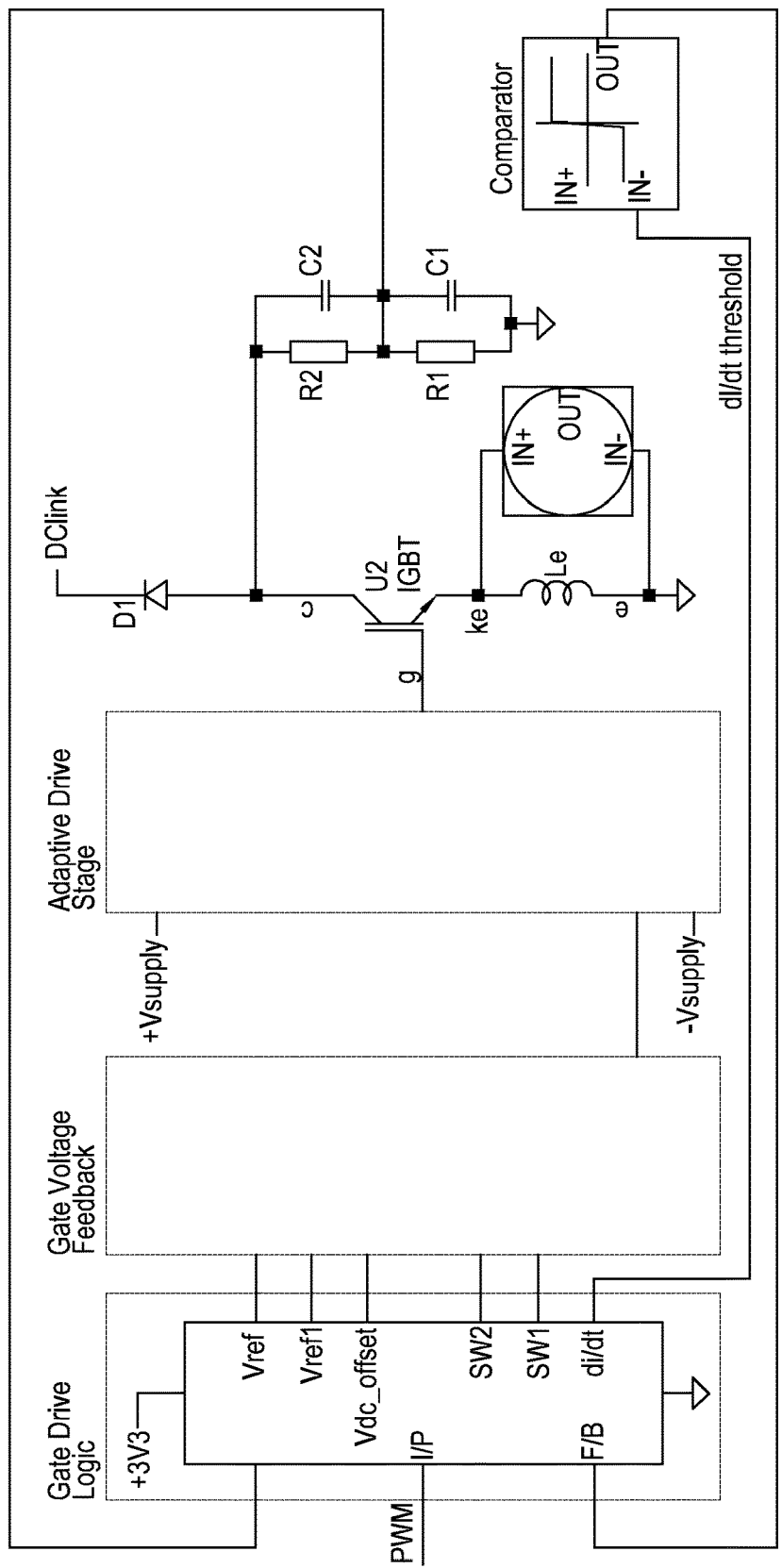
FIG. 9 shows a gate voltage feedback circuit with di/dt detection, optionally to be combined with FIG. 8a or 8b to control Vref1.

Such control of gate voltage may be further refined to enable driving of a power switch, e.g., IGBT, at a high voltage, but reducing the voltage under a short circuit condition. FIG. 9 shows an example of how the rate of change of power switch current may be measured and fed back to control a gate voltage feedback circuit such as that of FIG. 8a or 8b, preferably by means of gate drive logic. Specifically, the signal fed back from the power switch to indicate a reduction in impedance of the output circuit (preferably using a threshold comparison) may be used to control Vref1. Alternatively or additionally, the collector voltage (and/or rate of change thereof) may be fed back to indicate the reduction in output circuit impedance. Preferably this may be achieved using a potential divider wherein R1, R2 step the voltage down and optional capacitors C1 and/or C2 improve the speed of response.

Merely for clarity, the gate voltage feedback is not shown in FIG. 9, which for example shows short-circuit detection circuitry. However, the gate voltage feedback and control is shown FIGS. 8a, 8b. D1, U2 and L1 of FIG. 9 are part of a power converter, an example of which is shown in FIG. 11.

In view of the above, as shown in FIG. 9 the voltage detector coupled to the inductance L2, and comparator coupled to the feedback (F/B) input, may be considered to form at least part of a feedback circuit to generate a signal (e.g., a signal on the IN+ input of the comparator of FIG. 9) indicating rate of change of current or voltage of the power switch and respond to such a signal indicating a reduction of impedance of the driver output circuit (e.g., the output circuit comprising, e.g., the power switch U2, a commutation diode D1 and/or load (not shown in FIGS. 8a, 8b and 9)).

Thus, FIG. 8a and/or 8b may be combined with FIG. 9 such that the output from the di/dt comparator is fed back to gate drive control circuitry (e.g., gate drive logic of FIG. 9), which in response to the output indicating an above mentioned reduction of impedance controls a reference voltage input Vref1. Additionally or alternatively a comparator may be provided, e.g., within the gate drive logic, for comparison of a collector voltage feedback signal to a threshold value. Similarly may be provided for comparison of a rate of voltage change.

Figure 10:
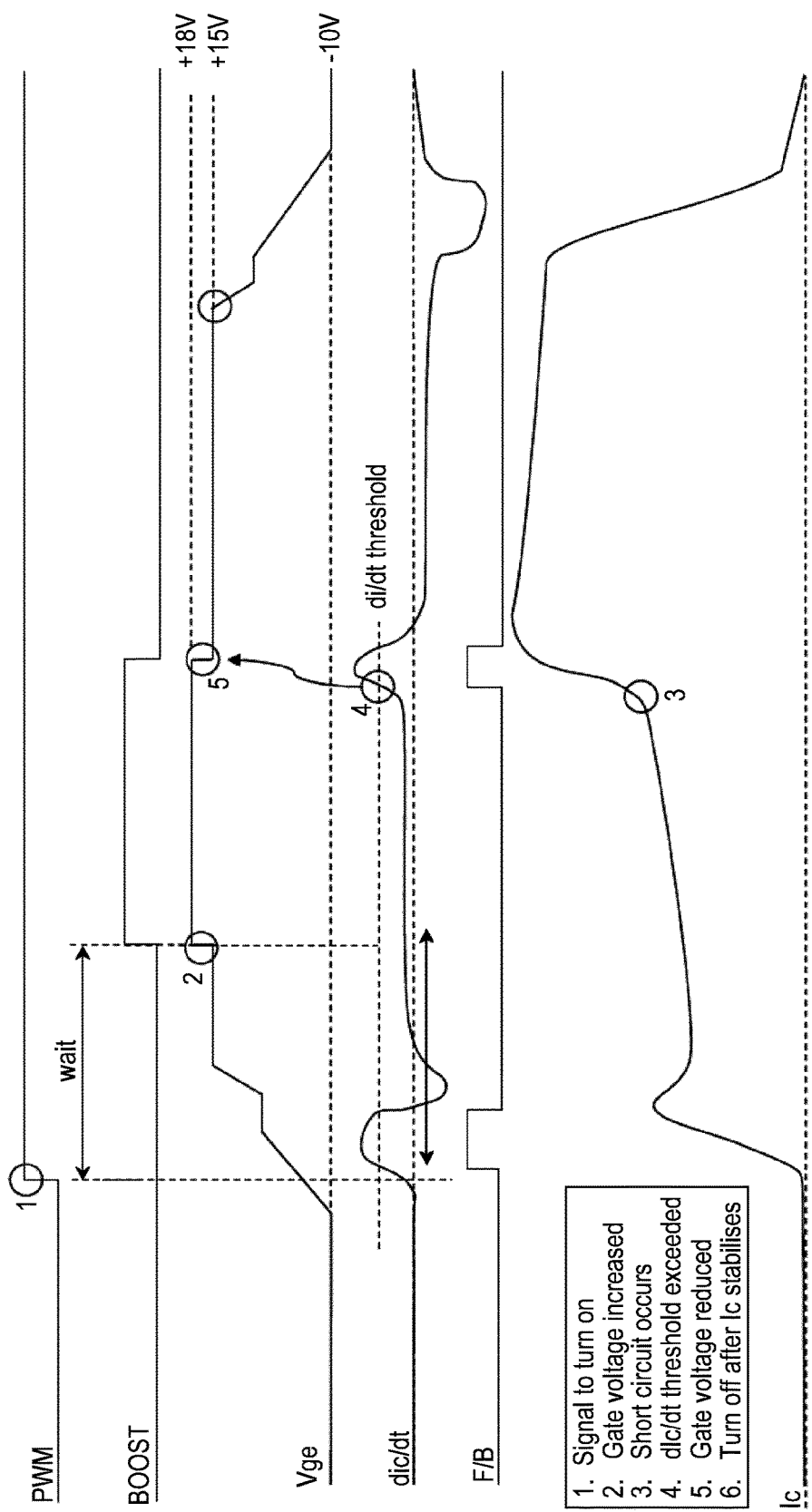
FIG. 10 shows an example turn on sequence with short-circuit detection.

An example sequence of events is shown in FIG. 10. Specifically, FIG. 10 shows a turn on sequence with short-circuit detection, wherein a turn-on signal (e.g., an edge of a pulse width modulation (PWM) signal) is received (for example on the PWM input line of FIG. 9) and the driver begins to turn on the power switch. Thus, the control terminal voltage Vge is increased, optionally nonlinearly as shown in FIG. 10. After turn-on and a preferably predetermined/preset delay, e.g., a suitable settling time to allow the voltage across the device to fall (i.e. suitable such that generally the switch does not turn on into a short circuit), the gate voltage Vge may be raised (e.g. to +18 V). This increase of Vge may be in response to a BOOST signal responsive to expiry of the delay. If high di/dt of the collector current is detected while BOOST is active, the high di/dt signalling a short circuit of the IGBT and/or load, the BOOST signal may return to an inactive state and the gate voltage consequently immediately returned to, e.g., +15 V (or lower), before being turned off after a further (preferably predetermined) delay. This "gate boost" capability may in an embodiment enable conduction losses to be reduced, e.g., by approximately 10%.

It is noted that the BOOST signal in FIG. 10 may be responsive to the feedback signal (F/B) indicating rate of change of collector current Ic (or drain-source current for a MOSFET) beyond a threshold. The same or different thresholds may be used to activate and deactivate BOOST. Use of the BOOST signal however is optional. Any one or more of the timing(s) of raising Vge to the boosted voltage, returning Vge to the lower voltage and/or turning off the power switch may be determined for example by a detection based on the measurement of di/dt, measurement of voltage on/across the power switch (e.g., Vc, Vce) and/or use of a timer to implement any delay beyond such a detection. For example, the gate drive may act to turn the power switch turned off when the di/dt has not exceeded a threshold value during a preset delay time after the return of the gate voltage to the lower level (e.g., 15 V).

Consistent with the above, the features 1 to 6 as shown in FIG. 10 correspond to, respectively: (1) signal to turn on; (2) gate voltage increased; (3) short circuit occurs; (4) dIc/dt threshold exceeded; (5) gate voltage reduced; and (6) turn-off after Ic stabilises. The Vge voltage preceding feature 2 may be considered to be a first voltage and the Vge voltage between features 2 and 5 a second, boost voltage. The Vge voltage between 5 and 6 may be substantially (e.g., exactly or within 10%) equal to, or less than, the first voltage.

There are many different ways to detect current and/or di/dt, such as that shown in FIG. 9 involving measuring voltage across a stray inductance (Le) between the auxiliary or kelvin emitter (ke) and the power emitter (e). If this voltage exceeds a specific threshold, then the gate drive may be signalled to lower the gate voltage.

Further Comments

It is particularly noted that a single embodiment may implement any one or more of the techniques or circuits as discussed above under any one or more of the headings "Emulation", "Control regarding dV/dt", "Clamping" and "Gate Boost".

Example advantages that may be achievable by any one or more such embodiment are, inter alia, any one or more of the following:

ability to emulate various resistors in one circuit that can be controlled by software; thus multiple stages multiple stages may not be required;

reduce conduction losses, preferably still protecting the device under short circuit;

reduce conduction losses, e.g., by improved trade-off of losses for a given dv/dt;

protect motor windings from high dv/dt which causes insulation degradation;

greater power throughput in a converter, e.g., by operation of a power converter at higher DC link voltage;

reduced or better compromise of switching losses through a specific profile of drive current;

reduced conduction losses, e.g., by boosting the gate voltage;

improved overvoltage clamp removing the need for transorbs;

emulation of turn-on and/or turn-off resistors;

reduction of product variants through the use of a building block that can be configured in the factory or field;

reduced cost and/or reduced board area, e.g., for a design that incorporates multiple features;

constant rise/fall time (dv/dt), e.g., through ability to adapt on a cycle by cycle basis;

limit overvoltage clamping, e.g., through ability to adapt on a cycle by cycle basis.

It is further noted that any embodiment of the present invention may additionally or alternatively conform to the definitions of any one or more of the arrangements as in E1 to E25 and F1 to F34 below:

E1. A power switch driver for driving a control terminal of a power switch to drive a load, the power switch driver comprising:
a controllable voltage source to provide a control terminal reference voltage;
a voltage control circuit for controlling voltage on the control terminal of the power switch according to the control terminal reference voltage, the voltage control circuit configured to provide an output signal to vary the voltage on the control terminal; and
a feedback circuit to generate a signal indicating a rate of change of at least one of a current or voltage of the power switch and to, in response to said signal indicating a reduction of impedance of an output circuit of the power switch driver, control the controllable voltage source to reduce the control terminal reference voltage, said reduction to reduce the controlled voltage.

E2. Power switch driver of E1, wherein the voltage control circuit comprises a gate voltage feedback circuit configured to control an output stage of the power switch driver dependent on the control terminal reference voltage and an indicator of voltage on the control terminal, the output stage configured to control the reduction of controlled voltage according to an output of the gate voltage feedback circuit.

E3. Power switch driver of E1 or E2, comprising:
an input line to receive a turn-on signal to instruct turn-on of the power switch, wherein:
the voltage control circuit is configured to, in response to the turn-on signal, raise the voltage on the control terminal to a boost voltage; and
said reduction of the controlled voltage is a reduction from the boost voltage.

E4. Power switch driver of any one of E1 to E3, wherein the feedback circuit comprises a comparator to receive the signal indicating the rate of change and to compare the received signal to a threshold, the comparator configured to output a result of the comparison to provide the indication of reduction of impedance.

E5. Power switch driver of any one of E1 to E4, wherein the voltage control circuit is configured to, in response to the turn-on signal, control the output signal to generate a first voltage on the control terminal of the power switch, the voltage control circuit is configured to further control the output signal for generating the second, boost voltage on the control terminal of the power switch at a time delay after the response to the turn-on signal.

E6. Power switch driver of any one of E1 to E5, wherein the first voltage is for turning the power switch on.

E7. Power switch driver of E6, wherein the reduced control terminal reference voltage below the boost voltage is the first voltage, more preferably below the first voltage.

E8. Power switch driver of any one of E1 to E7, wherein the reduced control terminal reference voltage is to maintain the power switch on.

E9. Power switch driver of any one of E1 to E8, wherein the feedback circuit is configured to, at a time delay after the control to reduce the control terminal reference voltage, control the controllable voltage source to reduce the control terminal reference voltage to turn the power switch off.

E10. Power switch driver of any one of E1 to E9, the power switch driver having a negative feedback circuit to control current delivered to the control terminal, the negative feedback circuit comprising:
a current output circuit comprising at least one of a current source and a current sink, the current output circuit for providing the current of the control terminal and configured to receive an output current control signal to control magnitude of the current provided by the current output circuit;
a terminal voltage input circuit for receiving a voltage from the control terminal and to output an indication of said voltage;
an amplifier coupled to amplify the terminal voltage indication to generate an amplifier output; and
a reference voltage input circuit for receiving a reference voltage, comprising at least one resistor, the reference voltage input circuit coupled to a charge supply input of the amplifier,
wherein
the power switch driver is configured to generate the output current control signal dependent on the amplifier output, and
the power switch driver is configured to reduce the current provided by the current output circuit responsive to an increase in the voltage received by the terminal voltage input circuit.

E11. Power switch driver of E10, wherein the current output circuit is configured to emulate the reference voltage input circuit.

E12. Power switch driver of E10 or E11, comprising:
a coupling switch to disable dependency of control of the amplifier on said terminal voltage input circuit.

E13. Power switch driver of any one of E10 to E12, comprising:
a coupling switch to enable dependency of control of the amplifier on the control terminal reference voltage.

E14. Power switch driver of any one of E1 to E13, configured to monitor voltage across an inductance to provide the signal indicating the rate of change of current of the power switch.

E15. Power switch driver of any one of E1 to E14, wherein the power switch comprises one of an IGBT, MOSFET, HEMT or JFET, the power switch preferably comprising silicon carbide, gallium nitride and/or silicon.

E16. Power switch driver of any one of E1 to E15, comprising the power switch.

E17. Power converter comprising the power switch driver of E16.

E18. Method for controlling a drive signal to a control terminal of a power switch to drive a load, comprising:
in response to a turn-on signal, controlling the drive signal to generate a boost voltage on the control terminal, the boost voltage to turn the power switch on;
when the voltage on the control terminal is the boost voltage, monitoring at least one of current and voltage of the power switch to detect a reduction in impedance of an output circuit comprising the power switch; and
reducing the voltage on the control terminal below the boost voltage when the monitored current or voltage indicates said reduction of impedance.

E19. Method of E18, wherein the controlling the drive signal to generate the boost voltage comprises:
in response to the turn-on signal, controlling the drive signal to generate a first voltage on the control terminal, the first voltage to turn the power switch on; and
at a time delay after said turn-on signal, further controlling said drive signal to generate a second voltage on the control terminal, wherein the second voltage is the boost voltage, said further controlling to turn the device on to a lower loss state.

E20. Method of E18 or E19, wherein said time delay expires when a voltage across the power switch falls below a threshold value.

E21. Method of any one of E18 to E20, wherein the reducing the voltage below the boost voltage comprises reducing the voltage to the first voltage.

E22. Method of any one of E18 to E21, comprising turning the power switch off at a time delay after said reducing the voltage on the control terminal below the boost voltage, preferably wherein said time delay is a preset time delay, alternatively preferably wherein expiry of the time delay is determined by comparison of a threshold value to at least one of a voltage signal and current signal of the power switch.

E23. Method of any one of E18 to E22, wherein the monitoring comprises monitoring rate of change of current through the power switch.

E24. Method of any one of E18 to E23, comprising comparing the monitored rate of change of current to a threshold value to provide the indication of reduction of impedance.

E25. Method of any one of E18 to E24, wherein the monitoring is to detect a short-circuit condition of the output circuit comprising the power switch and a load coupled to an output of the power switch.

F1. A power switch driver for driving a control terminal of a power switch to drive a load, the power switch driver having a negative feedback circuit to control current delivered to the control terminal, the negative feedback circuit comprising:
a current output circuit comprising at least one of a current source and a current sink, the current output circuit for providing the current of the control terminal and configured to receive an output current control signal to control magnitude of the current provided by the current output circuit;
a terminal voltage input circuit for receiving a voltage from the control terminal and to output an indication of said voltage;
an amplifier coupled to amplify the terminal voltage indication to generate an amplifier output; and
a reference voltage input circuit for receiving a reference voltage, comprising at least one resistor, the reference voltage input circuit coupled to a charge supply input of the amplifier,
wherein
the power switch driver is configured to generate the output current control signal dependent on the amplifier output, and
the power switch driver is configured to reduce the current provided by the current output circuit responsive to an increase in the voltage received by the terminal voltage input circuit.

F2. Power switch driver of F1, wherein the current output circuit is configured to emulate the reference voltage input circuit.

F3. Power switch driver of F1 or F2, wherein the at least one resistor comprises a controllable resistor.

F4. Power switch driver of any one of F1 to F3, wherein the terminal voltage input circuit has a coupling to the reference voltage input circuit, to effectively increase the impedance presented to the control terminal.

F5. Power switch driver of any one of F1 to F4, wherein the power switch driver has an offset voltage input circuit having an input line to receive an offset voltage and comprising a comparator to compare an indication of said voltage of the terminal voltage input circuit to the offset voltage, the offset voltage input circuit to allow a limit of variation of the voltage from the power switch control terminal to be set by the offset voltage when the power switch driver is operated to drive the power switch.

F6. Power switch driver of any one of F1 to F5, comprising a coupling switch to disable dependency of control of the amplifier on said voltage of the terminal voltage input circuit, preferably wherein the driver comprises a current detector for monitoring a current through the load and is configured to disable said dependency when the current detector indicates the monitored current below a threshold current, the power switch driver to provide a substantially constant said current of the current output circuit when the dependency is disabled.

F7. Power converter comprising the power switch driver of F6, the power converter comprising at least one half bridge circuit comprising a series connection of a first power switch and a second power switch, the first and second power switches configured to alternately pass current for driving the load coupled to an output line of the half bridge circuit, each said power switch coupled in parallel with a diode, wherein the power converter comprises at least one said power switch driver to drive a respective said power switch, wherein the at least one resistor of the power switch driver comprises a controllable resistor, the power converter comprising:
a turn-on detector to indicate at least a start of a turn-on period of increasing current through at least one of the power switches,
wherein
the power converter is configured to control the coupling switch of at least one said power switch driver based on the turn-on detector indication to allow the dependency of control of the amplifier of the driver on said voltage of the terminal voltage input circuit of the driver during the turn-on period.

F8. Power converter of F7, wherein the turn-on detector is configured to detect an increase in rate of change of the current through the at least one power switch and a subsequent decrease in the rate of change to indicate pendency of the turn-on period.

F9. Power converter of F7 or F8, configured to control the coupling switch of at least one said power switch driver to allow the dependency of control of the amplifier of the driver on said voltage of the terminal voltage input circuit of the driver during a period subsequent to the turn-on period, the power converter configured to increase resistance of the controllable resistor of the driver at the start of the subsequent period.

F10. Power converter of F7 or F8, configured to control the coupling switch of at least one said power switch driver to disable said dependency of control of the amplifier of the driver on said voltage of the terminal voltage input circuit of the driver during a period subsequent to the turn-on period, the power converter to deliver a substantially constant said current of the current output circuit of the driver during the subsequent period.

F11. Power converter of any one of F7 to F10, comprising a timing detector to indicate at least one of:
 a reversal of direction of rate of change of the current through the at least one power switch at a start of the subsequent period;
 a decrease in the rate of change of the current through the at least one power switch at the end of the subsequent period; and
 a voltage across the power switch below a threshold value at the end of the subsequent period,
 wherein
 the power converter is configured to perform the control of the coupling switch to control a duration of said dependency responsive to at least one said indication.

F12. Power converter comprising the power switch driver of any one of F1 to F6, the power converter comprising at least one half bridge circuit comprising a series connection of a first power switch and a second power switch, the first and second power switches configured to alternately pass current for driving the load coupled to an output line of the half bridge circuit, each said power switch coupled in parallel with a commutation diode, wherein the power converter comprises at least one said power switch driver to drive a respective said power switch, wherein the at least one resistor of the power switch driver comprises a controllable resistor, the power converter comprising:
 a timer circuit to measure duration of at least one phase of a switching cycle of the power switch,
 wherein
 the power converter is configured to adjust resistance of the controllable resistor in response to at least one said measured duration.

F13. Power converter for driving an inductive load comprising a winding, the power converter comprising at least one half bridge circuit comprising a series connection of a first power switch and a second power switch, the first and second power switches configured to alternately pass current for driving the load coupled to an output line of the half bridge circuit, wherein the power converter comprises at least one power switch driver according to any one of F1 to F6 to drive a respective said power switch, wherein the at least one resistor of the power switch driver comprises a controllable resistor, the power converter comprising:
 a current detector for monitoring a current through the load,
 wherein
 the power converter is configured to increase the resistance of the controllable resistor of at least one said driver when the current detector indicates the monitored current below a threshold current.

F14. Power converter of F13, wherein the power switch driver coupled to drive the respective power switch comprises the current detector configured to monitor a current through the respective power switch, the power switch driver configured to increase the resistance of the controllable resistor of the power switch driver when the current detector detects the monitored current below the threshold current.

F15. Power converter of F13 or F14, configured to increase the resistance of the controllable resistor substantially in inverse proportion to the monitored current.

F16. Power converter of any one of F13 to F15, the increase of the resistance for reducing rate of change of voltage on the output line during current commutation from at least one of said first and second power switches of the half bridge circuit.

F17. Power converter of any one of F13 to F16, comprising at least two said half bridge circuits, the power converter configured for driving the load by passing the current through the first power switch of a first said half bridge circuit and a second power switch of a second said half bridge circuit, the power converter configured to increase the resistance of the controllable resistor of at least one of the first power switch of the first half bridge circuit and the second power switch of the second half bridge circuit, said increase for damping a rate of change of voltage across the winding of the load.

F18. Power converter comprising at least one power switch driver for driving a control terminal of a power switch to drive a load, the power converter comprising at least one half bridge circuit comprising a series connection of a first said power switch and a second said power switch, the first and second power switches configured to alternately pass current for driving the load coupled to an output line of the half bridge circuit, each said power switch coupled in parallel with a diode, wherein the at least one power switch driver is configured to drive a respective said power switch and the power converter comprises:
 at least one clamp comparator to compare an indicator of a variable of the power switch to a clamp value,
 wherein
 the power switch driver is configured to reverse a direction of current flow between the power switch driver and the control terminal of the power switch when the clamp comparator indicates that the power switch variable indicator exceeds the clamp value,
 the power switch variable comprises at least one of:
 voltage across the power switch;
 rate of change of current through the power switch; and
 rate of change of voltage across the power switch.

F19. Power converter of F18, configured to perform said reversal when the clamp comparator indicates that the power switch variable indicator exceeds the clamp value during an OFF period of the power switch.

F20. Power converter of F18 or F19, wherein the power converter comprises a capacitive impedance coupled across the power switch, preferably wherein the capacitive impedance comprises a potential divider having impedances in series across the power switch, a coupling of said series impedances configured to provide the indicator of voltage across the power switch, wherein each said series impedance comprises a capacitance.

F21. Power converter of any one of F18 to F20, wherein the power switch driver is as defined in any one of F1 to F6.

F22. Power converter of any one of F18 to F21, wherein the power converter comprises:
at least one limit comparator to compare an indicator of a variable of the power switch to a limit value,
wherein
the power switch driver is configured to, during each of a series of on-off switching cycles of the power switch:
reduce a circuit variable if the limit comparator indicates that the power switch variable indicator remains less than the limit value during an OFF period of the power switch; and
increase the circuit variable if the comparator indicates that the power switch variable indicator exceeds the limit value during an OFF period of the power switch,
the circuit variable comprises at least one of:
a controllable output resistance of the power switch driver; and
current to a control terminal of the power switch, and the power switch variable comprises at least one of:
voltage across the power switch;
rate of change of current through the power switch; and
rate of change of voltage across the power switch.

F23. Power converter of F22, wherein the circuit variable comprises the controllable output resistance and the power switch driver comprises an output stage comprising a series connection of a control switch and a controllable resistor having the controllable output resistance, the series connection for bleeding a current of the control terminal, the current for turning the power switch off.

F24. Power converter of F22, wherein the power switch driver is according to any one of F1 to F6, wherein the circuit variable comprises the controllable output resistance and the power switch driver is configured to adjust resistance of the at least one resistor to perform at least one of said increase and decrease of the circuit variable.

F25. Power converter of F22, wherein the power switch driver is according to any one of F1 to F6, wherein the current to the control terminal is the current provided by the output circuit.

F26. Power converter of any one of F18 to F25, the power converter having at least two phase legs and a DC link coupled across each of the phase legs to have a voltage in common to the phase legs, wherein the power switch driver comprises:
an output stage providing a controllable output resistance, the output stage for conducting a current of the control terminal, the current for turning the power switch off;
a feedback line to receive an indicator of the voltage in common; and
a drive stage controller coupled to the feedback line and configured to control the controllable output resistance based on the voltage indicator received on the feedback line.

F27. Power converter of F26, wherein the drive stage controller is configured to increase the controllable output resistance when the voltage indicator indicates an increase in said voltage in common.

F28. Power converter of F26 or F27, wherein the drive stage controller is configured to increase the controllable output resistance when the voltage indicator indicates the voltage in common above a threshold link voltage value.

F29. Power converter of any one of F26 to F28, comprising a central controller for controlling a plurality of power switch drivers, the central controller comprising the drive stage controller.

F30. Power converter of any one of F26 to F29, wherein the output stage comprises a series connection of a control switch and a controllable resistor having the controllable output resistance.

F31. Power converter of any one of F26 to F29, wherein the power switch driver is according to any one of F1 to F6, the output stage comprising the current output circuit, wherein the power switch driver is configured to adjust resistance of the at least one resistor to perform the control of the controllable output resistance.

F32. Power converter of any one of F26 to F31, the power converter comprising the DC link.

F33. A power converter comprising the power switch driver of any one of F1 to F6, the power converter preferably further according to any one of F7 to F32.

F34. Power switch driver of any one of F1 to F6 or Power converter of any one of F7 to F33, wherein the power switch comprises one of an IGBT, MOSFET, HEMT or JFET, the power switch preferably comprising silicon carbide, gallium nitride and/or silicon.

No doubt many other effective alternatives will occur to the skilled person based on reading the above. For example, during each phase (1 to 10) of an IGBT switching waveform (FIG. 12) different drive mechanisms can be employed to optimize behavior. In some circumstances a voltage source with resistance to set the drive current is optimal, at other times a current source is preferable, and at others it is better for the gate to be held at a specific voltage. An adaptive drive such as that of FIG. 6a, 6b, 8a or 8b may fulfil these three tasks in one optimal circuit design. In an embodiment, the drive profile may be fixed or changed during operation, either within a single cycle, from cycle to cycle due to change in load conditions, or over the long term due to parameter variance (e.g. degradation due to ageing).

It will be understood that the invention is not limited to the described embodiments and encompasses modifications apparent to those skilled in the art lying within the spirit and scope of the claims appended hereto.

The invention claimed is:

1. A power switch driver for driving a control terminal of a power switch to drive a load, the power switch driver having a negative feedback circuit to control current delivered to the control terminal, the negative feedback circuit comprising:
a current output circuit having a current source and a current sink and serving for providing the current of the control terminal and configured to receive an output current control signal to control a magnitude of the current provided by the current output circuit;
a terminal voltage input circuit for receiving a voltage from the control terminal and to output an indication of the voltage;
an amplifier coupled to the terminal voltage input circuit for amplifying the terminal voltage indication to generate an amplifier output; and
a reference voltage input circuit for receiving a reference voltage, having at least one resistor, and coupled to a charge supply input of the amplifier,
wherein,
to emulate a resistance of the power switch driver, the reference voltage and the one resistor determine a reference current to be sent to the amplifier, the power switch driver is configured to generate the output current control signal dependent on the amplifier output, and the power switch driver is configured to reduce the current provided by the current output circuit in response to an increase in the voltage received by the terminal voltage input circuit.

2. The power switch driver of claim 1, wherein the at least one resistor is a controllable resistor.

3. The power switch driver of claim 1, wherein the terminal voltage input circuit has a coupling to the reference voltage input circuit, to effectively increase an impedance presented to the control terminal.

4. The power switch driver of claim 1, wherein the power switch driver has an offset voltage input circuit having an input line to receive an offset voltage and having a comparator to compare the indication of a voltage of the terminal voltage input circuit to the offset voltage, the offset voltage input circuit to allow a limit of variation of the voltage from the terminal to be set by the offset voltage when the power switch driver is operated to drive the power switch.

5. The power switch driver of claim 1, further comprising:
a coupling switch to disable dependency of control of the amplifier on the voltage of the terminal voltage input circuit, the power switch driver having a current detector for monitoring a current through the load and being configured to disable the dependency when the current detector indicates that the monitored current is below a threshold current, the power switch driver providing a substantially constant current to the current output circuit when the dependency is disabled.

6. A power converter comprising the power switch driver of claim 1.

7. The power switch driver of claim 1, wherein the power switch comprises one of an IGBT, MOSFET, H EMT or JFET, the power switch having silicon carbide, gallium nitride and/or silicon.

8. A power converter comprising power switch driver for driving a first power switch of the power converter or a second power switch of the power converter, the power switch having a negative feedback circuit for controlling current delivered to the control terminal,
the negative feedback circuit comprising:
a current output circuit having a current source and a current sink, the current output circuit providing current to the control terminal and configured to receive an output current control signal for controlling a magnitude of a current provided by the current output circuit;
a terminal voltage input circuit for receiving a voltage from the control terminal and for outputting an indication of the voltage;
an amplifier coupled to the terminal voltage input circuit for amplifying the terminal voltage indication to generate an amplifier output; and
a reference voltage input circuit for receiving a reference voltage, having at least one resistor, and coupled to a charge supply input of the amplifier,
wherein,
the power switch driver generates the output current control signal dependent on the amplifier output, and
the power switch driver reduces the current provided by the current output circuit in response to an increase in a voltage received by the terminal voltage input circuit;
the power switch driver further comprising a coupling switch for disabling dependency of control of the amplifier on the voltage of the terminal voltage input circuit, the driver having a current detector for monitoring a current through the load and disabling the dependency when the current detector indicates that the monitored current is below a threshold current, the power switch driver providing a substantially constant current to the current output circuit when the dependency is disabled;
the power converter having at least one half bridge circuit having a series connection of the first power switch and the second power switch, the first and second power switches configured to alternately pass current for driving the load coupled to an output line of the half bridge circuit, each of the first and second power switches being coupled in parallel with a diode,
the at least one resistor of the power switch driver is a controllable resistor, the power converter further comprising:
a turn-on detector for indicating at least a start of a turn-on period of increasing current through at least one of the power switches,
the power converter is configured to control the coupling switch based on the turn-on detector indication to allow the dependency of control of the amplifier on the voltage of the terminal voltage input circuit during the turn-on period.

9. The power converter of claim 8, wherein the turn-on detector is configured to detect an increase in rate of change of the current through the first or the second power switch and a subsequent decrease in the rate of change to indicate pendency of the turn-on period.

10. The power converter of claim 8, configured to control the coupling switch of the power switch driver to allow the dependency of control of the amplifier on the voltage of the terminal voltage input circuit during a period subsequent to the turn-on period, the power converter configured to increase resistance of the controllable resistor of the driver at the start of the subsequent period.

11. The power converter of claim 8, configured to control the coupling switch the power switch driver to disable the dependency of control of the amplifier on the voltage of the terminal voltage input circuit during a period subsequent to the turn-on period, the power converter to deliver a substantially constant the current of the current output circuit during the subsequent period.

12. The power converter of claim 8, further comprising a timing detector to indicate at least one of:
a reversal of direction of rate of change of the current through the first or second power switch at a start of the subsequent period;
a decrease in the rate of change of the current through the first or second power switch at the end of the subsequent period; and
a voltage across the power switch below a threshold value at the end of the subsequent period,
wherein
the power converter is configured to perform the control of the coupling switch to control a duration of the dependency responsive to the indication.

13. A power converter comprising the power switch driver for driving a first power switch of the power converter or a second power switch of the power converter, the power switch having a negative feedback circuit for controlling current delivered to the control terminal, the negative feedback circuit comprising:
- a current output circuit having a current source and a current sink, the current output circuit providing current to the control terminal and configured to receive an output current control signal for controlling a magnitude of a current provided by the current output circuit;
- a terminal voltage input circuit for receiving a voltage from the control terminal and for outputting an indication of the voltage;
- an amplifier coupled to the terminal voltage input circuit for amplifying the terminal voltage indication to generate an amplifier output; and
- a reference voltage input circuit for receiving a reference voltage, having at least one resistor, and coupled to a charge supply input of the amplifier, wherein,
- the power switch driver generates the output current control signal dependent on the amplifier output, and
- the power switch driver reduces the current provided by the current output circuit in response to an increase in a voltage received by the terminal voltage input circuit;
- the power converter has at least one half bridge circuit having a series connection of the first power switch and the second power switch, the first and second power switches configured to alternately pass current for driving the load coupled to an output line of the half bridge circuit, each of the first and second power switches being coupled in parallel with a commutation diode,
- the at least one resistor of the power switch driver is a controllable resistor, the power converter further comprising:
- a timer circuit to measure duration of at least one phase of a switching cycle of the power switch, wherein
- the power converter is configured to adjust resistance of the controllable resistor in response to the measured duration.

\* \* \* \* \*